United States Patent
Chau et al.

(10) Patent No.: US 9,368,583 B2
(45) Date of Patent: *Jun. 14, 2016

(54) FIELD EFFECT TRANSISTOR WITH NARROW BANDGAP SOURCE AND DRAIN REGIONS AND METHOD OF FABRICATION

(71) Applicant: Intel Corporation, Santa Clara, CA (US)

(72) Inventors: Robert S. Chau, Beaverton, OR (US); Suman Datta, Beaverton, OR (US); Jack Kavalieros, Portland, OR (US); Justin K. Brask, Portland, OR (US); Mark L. Doczy, Portland, OR (US); Matthew Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/702,608

(22) Filed: May 1, 2015

(65) Prior Publication Data

US 2015/0236100 A1    Aug. 20, 2015

Related U.S. Application Data

(60) Continuation of application No. 14/465,636, filed on Aug. 21, 2014, now Pat. No. 9,048,314, which is a continuation of application No. 14/137,804, filed on Dec. 20, 2013, now Pat. No. 8,816,394, which is a (Continued)

(51) Int. Cl.
*H01L 29/66* (2006.01)
*H01L 29/201* (2006.01)

(Continued)

(52) U.S. Cl.
CPC .......... *H01L 29/201* (2013.01); *H01L 29/0649* (2013.01); *H01L 29/0847* (2013.01); *H01L 29/1033* (2013.01); *H01L 29/207* (2013.01); *H01L 29/517* (2013.01); *H01L 29/78* (2013.01)

(58) Field of Classification Search
CPC ..................... H01L 29/2003; H01L 29/66462; H01L 29/7787; H01L 29/7783; H01L 29/802
USPC ........................... 257/192, 366, 401; 438/471
See application file for complete search history.

(56) References Cited

U.S. PATENT DOCUMENTS

| | | | |
|---|---|---|---|
| 3,387,820 | A | 6/1968 | Sanderfer et al. |
| 4,231,149 | A | 11/1980 | Chapman et al. |

(Continued)

FOREIGN PATENT DOCUMENTS

| | | |
|---|---|---|
| DE | 102 03 998 A1 | 8/2003 |
| EP | 0265314 | 4/1988 |

(Continued)

OTHER PUBLICATIONS

International Search Report PCT/US2003/026242.

(Continued)

*Primary Examiner* — Jami M Valentine
(74) *Attorney, Agent, or Firm* — Blakely, Sokoloff, Taylor & Zafman LLP

(57) ABSTRACT

A transistor having a narrow bandgap semiconductor source/drain region is described. The transistor includes a gate electrode formed on a gate dielectric layer formed on a silicon layer. A pair of source/drain regions are formed on opposite sides of the gate electrode wherein said pair of source/drain regions comprise a narrow bandgap semiconductor film formed in the silicon layer on opposite sides of the gate electrode.

19 Claims, 7 Drawing Sheets

Related U.S. Application Data continuation of application No. 13/752,272, filed on Jan. 28, 2013, now Pat. No. 8,664,694, which is a continuation of application No. 13/453,403, filed on Apr. 23, 2012, now Pat. No. 8,368,135, which is a continuation of application No. 13/021,640, filed on Feb. 4, 2011, now Pat. No. 8,183,646, which is a division of application No. 12/850,582, filed on Aug. 4, 2010, now Pat. No. 7,893,506, which is a continuation of application No. 12/343,400, filed on Dec. 23, 2008, now Pat. No. 7,825,481, which is a division of application No. 11/064,996, filed on Feb. 23, 2005, now Pat. No. 7,518,196.

(51) Int. Cl.

| | | |
|---|---|---|
| *H01L 29/06* | (2006.01) | |
| *H01L 29/207* | (2006.01) | |
| *H01L 29/10* | (2006.01) | |
| *H01L 29/51* | (2006.01) | |
| *H01L 29/08* | (2006.01) | |
| *H01L 29/78* | (2006.01) | |

(56) References Cited

U.S. PATENT DOCUMENTS

| | | |
|---|---|---|
| 4,487,652 A | 12/1984 | Almgren |
| 4,711,701 A | 12/1987 | McLevige |
| 4,751,201 A | 6/1988 | Nottenburg et al. |
| 4,818,715 A | 4/1989 | Chao |
| 4,871,692 A | 10/1989 | Lee et al. |
| 4,872,046 A | 10/1989 | Morkoc et al. |
| 4,905,063 A | 2/1990 | Beltram et al. |
| 4,906,589 A | 3/1990 | Chao |
| 4,907,048 A | 3/1990 | Huang |
| 4,914,059 A | 4/1990 | Nissim et al. |
| 4,994,873 A | 2/1991 | Madan |
| 4,996,574 A | 2/1991 | Shirasaki |
| 5,023,203 A | 6/1991 | Choi |
| 5,120,666 A | 6/1992 | Gotou |
| 5,124,777 A | 6/1992 | Lee et al. |
| 5,179,037 A * | 1/1993 | Seabaugh ............. B82Y 10/00 257/E21.697 |
| 5,216,271 A | 6/1993 | Takagi et al. |
| 5,218,213 A | 6/1993 | Gaul et al. |
| 5,266,518 A | 11/1993 | Binsma et al. |
| 5,278,012 A | 1/1994 | Yamanaka et al. |
| 5,278,102 A | 1/1994 | Horie |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,371,024 A | 12/1994 | Hieda et al. |
| 5,391,506 A | 2/1995 | Tada et al. |
| 5,398,641 A | 3/1995 | Shih |
| 5,428,237 A | 6/1995 | Yuzurihara et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,495,115 A | 2/1996 | Kudo et al. |
| 5,514,885 A | 5/1996 | Myrick |
| 5,521,859 A | 5/1996 | Ema et al. |
| 5,539,229 A | 7/1996 | Noble, Jr et al. |
| 5,543,351 A | 8/1996 | Hirai et al. |
| 5,545,586 A | 8/1996 | Koh |
| 5,554,870 A | 9/1996 | Fitch et al. |
| 5,563,077 A | 10/1996 | Ha et al. |
| 5,576,227 A | 11/1996 | Hsu |
| 5,578,513 A | 11/1996 | Maegawa |
| 5,595,919 A | 1/1997 | Pan |
| 5,595,941 A | 1/1997 | Okarnoto et al. |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,693,542 A | 12/1997 | Suh et al. |
| 5,698,869 A * | 12/1997 | Yoshimi .............. H01L 27/1203 257/192 |
| 5,701,016 A | 12/1997 | Burroughs et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa |
| 5,773,331 A | 6/1998 | Soloman et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,544 A | 9/1998 | Huang |
| 5,814,545 A | 9/1998 | Seddon et al. |
| 5,814,895 A | 9/1998 | Hirayama |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,859,456 A | 1/1999 | Efland et al. |
| 5,880,015 A | 3/1999 | Hata |
| 5,883,564 A | 3/1999 | Partin |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 5,981,400 A | 11/1999 | Lo |
| 5,985,726 A | 11/1999 | Yu et al. |
| 6,010,921 A | 1/2000 | Soutome |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,063,677 A | 5/2000 | Rodder et al. |
| 6,066,869 A | 5/2000 | Noble et al. |
| 6,087,208 A | 7/2000 | Krivokapic et al. |
| 6,093,621 A | 7/2000 | Tseng |
| 6,093,947 A | 7/2000 | Hanafi et al. |
| 6,114,201 A | 9/2000 | Wu |
| 6,114,206 A | 9/2000 | Yu |
| 6,117,697 A | 9/2000 | Seaford et al. |
| 6,117,741 A | 9/2000 | Chatterjee et al. |
| 6,120,846 A | 9/2000 | Hintermaier et al. |
| 6,124,177 A | 9/2000 | Lin et al. |
| 6,130,123 A | 10/2000 | Liang et al. |
| 6,133,593 A | 10/2000 | Boos et al. |
| 6,144,072 A | 11/2000 | Iwamatsu et al. |
| 6,150,222 A | 11/2000 | Gardner et al. |
| 6,153,485 A | 11/2000 | Pey et al. |
| 6,159,808 A | 12/2000 | Chuang |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,751 B1 | 6/2001 | Chu et al. |
| 6,251,763 B1 | 6/2001 | Inumiya et al. |
| 6,252,262 B1 | 6/2001 | Jonker et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chau et al. |
| 6,294,416 B1 | 9/2001 | Wu |
| 6,307,235 B1 | 10/2001 | Forbes et al. |

(56) References Cited

U.S. PATENT DOCUMENTS

| | | | |
|---|---|---|---|
| 6,310,367 B1 | 10/2001 | Yagishita et al. |
| 6,317,444 B1 | 11/2001 | Chakrabarti |
| 6,319,807 B1 | 11/2001 | Yeh et al. |
| 6,320,212 B1 | 11/2001 | Chow |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,406,795 B1 | 6/2002 | Hwang et al. |
| 6,407,442 B2 | 6/2002 | Inoue et al. |
| 6,410,371 B1 | 6/2002 | Yu et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,458,662 B1 | 10/2002 | Yu |
| 6,459,123 B1 | 10/2002 | Enders et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee |
| 6,483,151 B2 | 11/2002 | Wakabayashi et al. |
| 6,483,156 B1 | 11/2002 | Adkisson et al. |
| 6,495,403 B1 | 12/2002 | Skotnicki et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,515,339 B2 | 2/2003 | Shin et al. |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus et al. |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,607,948 B1 | 8/2003 | Sugiyama et al. |
| 6,610,576 B2 | 8/2003 | Nowak |
| 6,611,029 B1 | 8/2003 | Ahmed et al. |
| 6,630,388 B2 | 10/2003 | Ishii et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Flanner et al. |
| 6,705,571 B2 | 3/2004 | Shay et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,765,303 B1 | 7/2004 | Krivokapic et al. |
| 6,770,516 B2 | 8/2004 | Wu et al. |
| 6,774,390 B2 | 8/2004 | Sugiyama et al. |
| 6,780,694 B2 | 8/2004 | Doris et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin-Ming et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Matthew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,588 B1 | 2/2005 | Liao et al. |
| 6,855,606 B2 | 2/2005 | Chen et al. |
| 6,855,990 B2 | 2/2005 | Yeo et al. |
| 6,858,472 B2 | 2/2005 | Schoenfeld |
| 6,858,478 B2 | 2/2005 | Chau et al. |
| 6,864,519 B2 | 3/2005 | Yeo et al. |
| 6,864,540 B1 | 3/2005 | Divakaruni et al. |
| 6,867,433 B2 | 3/2005 | Yeo et al. |
| 6,867,460 B1 | 3/2005 | Anderson et al. |
| 6,869,868 B2 | 3/2005 | Chiu et al. |
| 6,869,898 B2 | 3/2005 | Inaki et al. |
| 6,870,226 B2 | 3/2005 | Maeda et al. |
| 6,872,643 B1 * | 3/2005 | Halliyal ............... H01L 21/265 257/E21.334 |
| 6,881,635 B1 | 4/2005 | Chidambarrao et al. |
| 6,884,154 B2 | 4/2005 | Mizushima et al. |
| 6,885,055 B2 | 4/2005 | Lee |
| 6,888,199 B2 | 5/2005 | Nowak et al. |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,946,377 B2 | 9/2005 | Chambers |
| 6,949,443 B2 | 9/2005 | Ke et al. |
| 6,955,961 B1 | 10/2005 | Chung |
| 6,955,969 B2 | 10/2005 | Djomehri et al. |
| 6,956,281 B2 | 10/2005 | Smith et al. |
| 6,960,517 B2 | 11/2005 | Rios et al. |

(56) References Cited

U.S. PATENT DOCUMENTS

| | | |
|---|---|---|
| 6,967,351 B2 | 11/2005 | Fried et al. |
| 6,969,878 B2 | 11/2005 | Coronel et al. |
| 6,970,373 B2 | 11/2005 | Datta et al. |
| 6,974,738 B2 | 12/2005 | Hareland |
| 6,975,014 B1 | 12/2005 | Krivokapic et al. |
| 6,977,415 B2 | 12/2005 | Matsuo |
| 6,982,433 B2 | 1/2006 | Hoffman et al. |
| 6,998,301 B1 | 2/2006 | Yu et al. |
| 6,998,318 B2 | 2/2006 | Park |
| 7,005,366 B2 | 2/2006 | Chau et al. |
| 7,013,447 B2 | 3/2006 | Mathew et al. |
| 7,018,551 B2 | 3/2006 | Beintner et al. |
| 7,041,601 B1 | 5/2006 | Yu et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,045,451 B2 | 5/2006 | Shenai-Khatkhate et al. |
| 7,049,654 B2 | 5/2006 | Chang |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay et al. |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,945 B2 | 10/2006 | Lee et al. |
| 7,115,954 B2 | 10/2006 | Shimizu et al. |
| 7,119,402 B2 | 10/2006 | Kinoshita et al. |
| 7,122,463 B2 | 10/2006 | Ohuchi |
| 7,132,360 B2 | 11/2006 | Schaefer et al. |
| 7,138,320 B2 | 11/2006 | Bentum et al. |
| 7,141,480 B2 | 11/2006 | Adam et al. |
| 7,141,856 B2 | 11/2006 | Lee et al. |
| 7,154,118 B2 | 12/2006 | Lindert |
| 7,163,851 B2 | 1/2007 | Abadeer et al. |
| 7,163,898 B2 | 1/2007 | Mariani et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,196,372 B1 | 3/2007 | Yu et al. |
| 7,214,991 B2 | 5/2007 | Yeo et al. |
| 7,235,822 B2 | 6/2007 | Li |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,367 B2 | 7/2007 | Vaartstra et al. |
| 7,250,645 B1 | 7/2007 | Wang et al. |
| 7,250,655 B2 | 7/2007 | Bae et al. |
| 7,256,455 B2 | 8/2007 | Ahmed et al. |
| 7,268,024 B2 | 9/2007 | Yeo et al. |
| 7,268,058 B2 | 9/2007 | Chau et al. |
| 7,273,785 B2 | 9/2007 | Dennard et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,326,634 B2 | 2/2008 | Lindert et al. |
| 7,329,913 B2 | 2/2008 | Brask et al. |
| 7,339,241 B2 | 3/2008 | Orlowski et al. |
| 7,341,902 B2 | 3/2008 | Anderson et al. |
| 7,348,284 B2 | 3/2008 | Doyle et al. |
| 7,348,642 B2 | 3/2008 | Nowak |
| 7,354,817 B2 | 4/2008 | Wantanabe et al. |
| 7,358,121 B2 | 4/2008 | Chau et al. |
| 7,385,262 B2 | 6/2008 | O'Keefee et al. |
| 7,388,259 B2 | 6/2008 | Doris et al. |
| 7,396,730 B2 | 7/2008 | Li |
| 7,439,120 B2 | 10/2008 | Pei |
| 7,452,778 B2 | 11/2008 | Chen et al. |
| 7,456,471 B2 | 11/2008 | Anderson et al. |
| 7,456,476 B2 | 11/2008 | Hareland et al. |
| 7,479,421 B2 | 1/2009 | Kavalieros et al. |
| 7,518,196 B2 | 4/2009 | Chau et al. |
| 7,573,059 B2 | 8/2009 | Hudait et al. |
| 7,585,734 B2 | 9/2009 | Kang et al. |
| 7,612,416 B2 | 11/2009 | Takeuchi et al. |
| 7,615,429 B2 | 11/2009 | Kim et al. |
| 7,655,989 B2 | 2/2010 | Zhu et al. |
| 7,701,018 B2 | 4/2010 | Yamagami et al. |
| 7,825,481 B2 | 11/2010 | Chau et al. |
| 7,893,506 B2 | 2/2011 | Chau et al. |
| 8,183,646 B2 | 5/2012 | Chau et al. |
| 8,368,135 B2 | 2/2013 | Chau et al. |
| 8,664,694 B2 | 3/2014 | Chau et al. |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2002/0185655 A1 | 12/2002 | Fahimulla et al. |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino |
| 2003/0067017 A1 | 4/2003 | Ieong et al. |
| 2003/0080332 A1 | 5/2003 | Phillips |
| 2003/0080384 A1 | 5/2003 | Takahashi et al. |
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0203636 A1 | 10/2003 | Anthony |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |

(56) References Cited

U.S. PATENT DOCUMENTS

| | | |
|---|---|---|
| 2004/0108558 A1 | 6/2004 | Kwak et al. |
| 2004/0110097 A1 | 6/2004 | Ahmed et al. |
| 2004/0110331 A1 | 6/2004 | Yeo et al. |
| 2004/0113181 A1 | 6/2004 | Wicker |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0169269 A1 | 9/2004 | Yeo et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219711 A1 | 11/2004 | Wu et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2004/0266076 A1 | 12/2004 | Doris et al. |
| 2005/0003612 A1 | 1/2005 | Hackler et al. |
| 2005/0017377 A1 | 1/2005 | Joshi et al. |
| 2005/0019993 A1 | 1/2005 | Lee et al. |
| 2005/0020020 A1 | 1/2005 | Collaert et al. |
| 2005/0023535 A1 | 2/2005 | Sriram |
| 2005/0023633 A1 | 2/2005 | Yeo et al. |
| 2005/0035391 A1 | 2/2005 | Lee et al. |
| 2005/0035415 A1 | 2/2005 | Yeo et al. |
| 2005/0040429 A1 | 2/2005 | Uppal |
| 2005/0040444 A1 | 2/2005 | Cohen |
| 2005/0059214 A1 | 3/2005 | Cheng et al. |
| 2005/0062082 A1 | 3/2005 | Bucher et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng et al. |
| 2005/0116218 A1 | 6/2005 | Yang |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehre |
| 2005/0133829 A1 | 6/2005 | Kunii et al. |
| 2005/0133866 A1 | 6/2005 | Chau et al. |
| 2005/0136584 A1 | 6/2005 | Boyanov et al. |
| 2005/0139860 A1 | 6/2005 | Snyder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161659 A1 * | 7/2005 | Bakkers ............ B82Y 10/00 |
| | | 257/9 |
| 2005/0161739 A1 | 7/2005 | Anderson et al. |
| 2005/0162928 A1 | 7/2005 | Rosmeulen |
| 2005/0167766 A1 | 8/2005 | Yagishita |
| 2005/0170593 A1 | 8/2005 | Kang et al. |
| 2005/0184316 A1 | 8/2005 | Kim et al. |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0202604 A1 | 9/2005 | Cheng et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0224800 A1 | 10/2005 | Lindert |
| 2005/0227498 A1 | 10/2005 | Furukawa et al. |
| 2005/0230763 A1 | 10/2005 | Huang et al. |
| 2005/0233156 A1 | 10/2005 | Senzaki et al. |
| 2005/0239252 A1 | 10/2005 | Ahn et al. |
| 2005/0255642 A1 | 11/2005 | Liu |
| 2005/0263821 A1 | 12/2005 | Cho et al. |
| 2005/0266622 A1 | 12/2005 | Arghavani et al. |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2005/0287752 A1 | 12/2005 | Nouri et al. |
| 2006/0001095 A1 | 1/2006 | Doris et al. |
| 2006/0014338 A1 | 1/2006 | Doris et al. |
| 2006/0040054 A1 | 2/2006 | Pearlstein et al. |
| 2006/0043500 A1 | 3/2006 | Chen et al. |
| 2006/0046521 A1 | 3/2006 | Vaartstra et al. |
| 2006/0057792 A1 | 3/2006 | Mathew et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071275 A1 | 4/2006 | Brask et al. |
| 2006/0071299 A1 | 4/2006 | Doyle et al. |
| 2006/0086977 A1 | 4/2006 | Shah et al. |
| 2006/0091432 A1 | 5/2006 | Guha et al. |
| 2006/0113605 A1 | 6/2006 | Currie |
| 2006/0138548 A1 | 6/2006 | Richards et al. |
| 2006/0148182 A1 | 7/2006 | Datta et al. |
| 2006/0154478 A1 | 7/2006 | Hsu et al. |
| 2006/0170066 A1 | 8/2006 | Mathew et al. |
| 2006/0172479 A1 | 8/2006 | Furukawa et al. |
| 2006/0172480 A1 | 8/2006 | Wang et al. |
| 2006/0172497 A1 | 8/2006 | Hareland et al. |
| 2006/0180859 A1 | 8/2006 | Radosavljevic et al. |
| 2006/0186484 A1 * | 8/2006 | Chau ................. H01L 29/66628 |
| | | 257/401 |
| 2006/0202270 A1 | 9/2006 | Son et al. |
| 2006/0204898 A1 | 9/2006 | Gutsche et al. |
| 2006/0205164 A1 | 9/2006 | Ko et al. |
| 2006/0211184 A1 | 9/2006 | Boyd et al. |
| 2006/0220131 A1 | 10/2006 | Kinoshita et al. |
| 2006/0227595 A1 | 10/2006 | Chuang et al. |
| 2006/0240622 A1 | 10/2006 | Lee et al. |
| 2006/0244066 A1 | 11/2006 | Yeo et al. |
| 2006/0263699 A1 | 11/2006 | Abatchev et al. |
| 2006/0281325 A1 | 12/2006 | Chou et al. |
| 2006/0286729 A1 | 12/2006 | Kavalieros et al. |
| 2007/0001219 A1 | 1/2007 | Radosavljevic et al. |
| 2007/0004117 A1 | 1/2007 | Yagishita |
| 2007/0023795 A1 | 2/2007 | Nagano et al. |
| 2007/0029624 A1 | 2/2007 | Nowak |
| 2007/0045735 A1 | 3/2007 | Orlowski et al. |
| 2007/0045748 A1 | 3/2007 | Booth et al. |
| 2007/0048930 A1 | 3/2007 | Figura et al. |
| 2007/0052041 A1 | 3/2007 | Sorada et al. |
| 2007/0069293 A1 | 3/2007 | Kavalieros et al. |
| 2007/0069302 A1 | 3/2007 | Jin et al. |
| 2007/0090416 A1 | 4/2007 | Doyle et al. |
| 2007/0093010 A1 | 4/2007 | Mathew et al. |
| 2007/0108514 A1 | 5/2007 | Inoue et al. |
| 2007/0145487 A1 | 6/2007 | Kavalieros et al. |
| 2007/0187682 A1 | 8/2007 | Takeuchi et al. |
| 2007/0241414 A1 | 10/2007 | Narihiro |
| 2007/0259501 A1 | 11/2007 | Xiong et al. |

(56) References Cited

U.S. PATENT DOCUMENTS

| | | |
|---|---|---|
| 2007/0262389 A1 | 11/2007 | Chau et al. |
| 2008/0017890 A1 | 1/2008 | Yuan et al. |
| 2008/0017934 A1 | 1/2008 | Kim et al. |
| 2008/0102586 A1 | 5/2008 | Park |
| 2008/0111163 A1 | 5/2008 | Russ et al. |
| 2008/0116515 A1 | 5/2008 | Gossner et al. |
| 2008/0128796 A1 | 6/2008 | Zhu et al. |
| 2008/0128797 A1 | 6/2008 | Dyer et al. |
| 2008/0212392 A1 | 9/2008 | Bauer |
| 2008/0237655 A1 | 10/2008 | Nakabayashi et al. |
| 2008/0258207 A1 | 10/2008 | Radosavljevic et al. |
| 2009/0061572 A1 | 3/2009 | Hareland et al. |
| 2009/0090976 A1 | 4/2009 | Kavalieros et al. |
| 2009/0099181 A1 | 4/2009 | Wurster et al. |
| 2010/0200923 A1 | 8/2010 | Chen et al. |

FOREIGN PATENT DOCUMENTS

| | | |
|---|---|---|
| EP | 0469604 | 2/1992 |
| EP | 0474952 | 3/1992 |
| EP | 0510667 | 10/1992 |
| EP | 0 623963 A1 | 11/1994 |
| EP | 1 091 413 A2 | 4/2001 |
| EP | 1091413 | 4/2001 |
| EP | 1 202 335 A2 | 5/2002 |
| EP | 1 566 844 A2 | 8/2005 |
| GB | 2 156 149 | 10/1985 |
| JP | 56073454 | 6/1981 |
| JP | 56073454 A | 6/1981 |
| JP | 59 145538 A | 8/1984 |
| JP | 02-303048 A | 12/1990 |
| JP | 05090252 | 4/1993 |
| JP | 0600 5856 | 1/1994 |
| JP | 06005856 | 1/1994 |
| JP | 06-061260 | 3/1994 |
| JP | 06-151387 A | 5/1994 |
| JP | 6132521 | 5/1994 |
| JP | 6151387 | 5/1994 |
| JP | 06177089 | 6/1994 |
| JP | 406177089 A | 6/1994 |
| JP | 06224440 A | 8/1994 |
| JP | 7-50421 A | 2/1995 |
| JP | 09-074205 | 3/1997 |
| JP | 09162301 A | 6/1997 |
| JP | 10-004198 A | 6/1998 |
| JP | 200037842 A | 2/2000 |
| JP | 2000037842 | 2/2000 |
| JP | 2001-189453 | 7/2001 |
| JP | 2001 338987 | 12/2001 |
| JP | 2001338987 | 12/2001 |
| JP | 2002-009289 A | 1/2002 |
| JP | 2002-110963 A | 4/2002 |
| JP | 2002-298051 | 10/2002 |
| JP | 2002298051 | 10/2002 |
| JP | 2002-110977 A | 12/2002 |
| JP | 2003-229575 | 8/2003 |
| JP | 2003-298051 | 10/2003 |
| JP | 2004-221334 A | 8/2004 |
| JP | 2005085916 | 3/2005 |
| JP | 2005-173606 | 12/2006 |
| KR | 10 0222363 | 10/1999 |
| TW | 2004 14538 | 8/1992 |
| TW | 200414538 | 8/1992 |
| TW | 200518310 | 11/1992 |
| TW | 2005 18310 | 11/1998 |
| TW | 508669 | 11/2002 |
| TW | 516232 | 1/2003 |
| TW | I 543 150 B | 7/2003 |
| TW | 546713 | 8/2003 |
| TW | 548799 | 8/2003 |
| TW | 561530 | 11/2003 |
| TW | 200402872 A | 2/2004 |
| TW | 200405408 A | 4/2004 |
| TW | 591798 | 6/2004 |
| TW | 594990 | 6/2004 |
| TW | 2004 14539 | 8/2004 |
| TW | 2004 17034 | 9/2004 |
| TW | 200417034 | 9/2004 |
| TW | I223449 | 11/2004 |
| TW | I231994 | 5/2005 |
| TW | I238524 | 8/2005 |
| TW | I239102 | 9/2005 |
| TW | 200729407 | 8/2007 |
| TW | I321830 | 3/2010 |
| WO | WO-9106976 | 5/1991 |
| WO | WO01/18877 A | 3/2001 |
| WO | WO 02/43151 A1 | 5/2002 |
| WO | WO 02/095814 | 11/2002 |
| WO | WO-02095814 | 11/2002 |
| WO | WO 03/ 001 604 A2 | 1/2003 |
| WO | WO 03/003442 | 1/2003 |
| WO | WO-03003442 | 1/2003 |
| WO | WO 2004/059726 A1 | 7/2004 |
| WO | WO 2005/034212 A2 | 4/2005 |
| WO | WO 2005/036651 A1 | 4/2005 |
| WO | WO-2005036651 | 4/2005 |
| WO | WO 2005/098963 A1 | 10/2005 |
| WO | WO 2006/007350 A1 | 1/2006 |
| WO | WO 2006/078469 A1 | 7/2006 |
| WO | WO 2007/002426 A2 | 1/2007 |
| WO | WO 2007/041152 A1 | 4/2007 |
| WO | WO-2007038575 | 4/2007 |

OTHER PUBLICATIONS

International Search Report PCT/US2003/039727.
International Search Report PCT/US2003/040320.
International Search Report PCT/US2005/000947.
International Search Report PCT/US2005/010505.
International Search Report PCT/US2005/020339.
International Search Report PCT/US2005/033439.
International Search Report PCT/US2005/035380.
International Search Report PCT/US2004/032442.
International Search Report PCT/US2006/024516.
International Search Report and Written Opinion PCT/US2006/000378.
International Search Report PCT/US2006/037643.
International Search Report PCT/US2005/037169.
Sung Min Kim, et al., A Novel Multi-channel Field Effect Transistor (McFET) on Bulk Si for High Performance Sub-80nm Application, IEDM 04-639, 2004 IEEE, pp. 27.4.1-27.4.4.
Yang-Kyu Choi, et al., "A Spacer Patterning Technology for Nanoscale CMOS" IEEE Transactions on Electron Devices, vol. 49, No. 3, Mar. 2002, pp. 436-441.
W. Xiong, et al., "Corner Effect in Multiple-Gate SOI MOSFETs" 2003 IEEE, pp. 111-113.
Weize Xiong, et al., "Improvement of FinFET Electrical Characteristics by Hydrogen Annealing" IEEE Electron Device Letters, vol. 25, No. 8, Aug. 2004, XP-001198998, pp. 541-543.
Fu-Liang Yang, et al., "5nm-Gate Nanowire FinFET" 2004 Symposium on VLSI Technology Digest of Technical Papers, 2004 IEEE, pp. 196-197.
Jing Guo et al. "Performance Projections for Ballistic Carbon Nanotube Field-Effect Transistors" Applied Physics Letters, vol. 80, No. 17, Apr. 29, 2002, pp. 3192-2194.
Ali Javey et al., "High-K Dielectrics for Advanced Carbon-Nanotube Transistors and Logic Gates", Advance Online Publication, Published online, Nov. 17, 2002, pp. 1-6.
Richard Martel et al., "Carbon Nanotube Field Effect Transistors for Logic Applications" IBM, T.J. Watson Research Center, 2001 IEEE, IEDM 01, pp. 159-162.
David M. Fried et al., "Improved Independent Gate N-Type FinFET Fabrication and Characterization", IEEE Electron Device Letters, vol. 24, No. 9, Sep. 2003, pp. 592-594.
David M. Fried et al., "Improved Independent Gate P-Type Independent-Gate FinFETs", IEEE Electron Device Letters, vol. 25, No. 4, Apr. 2004, pp. 199-201.
Charles Kuo et al. "A Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

(56) References Cited

OTHER PUBLICATIONS

Charles Kuo et al., "A Capacitorless Double-Gate DRAM Cell Design for High Density Applications", 2002 IEEE International Electron Devices Meeting Technical Digest, Dec. 2002, pp. 843-846.
Takashi Ohsawa et al., "Memory Design Using a One-Transistor Gain Cell on SOI", IEEE Journal of Solid-State Circuits, vol. 37, No. 11, Nov. 2002, pp. 1510-1522.
T. Tanaka et al., Scalability Study on a Capacitorless 1T-DRAM: From Single-Gate PD-SOI to Double-Gate FinDram, 2004 IEEE International Electron Devices Meeting Technical Digest, Dec. 2004, (4 pgs.).
V. Subramanian et al. "A Bulk Si-Compatible Ultrathin-Body SOI Technology for Sub-100nm MOSFETS", Proceedings of the 57th Annual Device Reach Conference, (1999) pp. 28-29.
Hisamoto et al. "A Folded-Channel MOSFET for Deep-sub-tenth Micron Era", 1998 IEEE International Electron Device Meeting Technical Digest, (1998) pp. 1032-1034.
Huang et al., "Sub 50nm FinFet: PMOS", 1999 IEEE International Electron Device Meeting Technical Digets, (1999) pp. 67-70.
Auth et al., "Vertical, Fully-Depleted, Surroundings Gate MOSFETS on Sub 0.1 um Thick Silicon Pillars", 1996 54th Annual Device Reseach Conference Digest, (1996) pp. 108-109.
Hisamoto et al., "A Fully Depleted Lean-Channel Transistor (DELTA)—A Novel Vertical Ultrathin SOI MOSFET", IEEE Electron Device Letters, vol. 11 No. 1, (1990) pp. 36-38.
Jong-Tae Park et al., "Pi-Gate SOI MOSFET" IEEE Electron Device Letters, vol. 22, No. 8, Aug. 2001, pp. 405-406.
Digh Hisamoto et al., "FinFet—A Self Aligned Double-Gate MOSFET Scalable to 20nm", IEEE Transactions on Electron Devices, vol. 47, No. 12, Dec. 2000, pp. 2320-2325.
T. Park et al., "Fabrication of Body-Tied FinFETs (Omega MOSFETS) Using Bulk Si Wafers", 2003 Symposia on VLSI Technology Digest of Technical Papers, Jun. 2003, pp. 135-136.
A. Burenkov et al., "Corner Effect in Double and Triple Gate FinFets", IEEE 2003, pp. 135-138.
S.T. Chang et al., "3-D Simulation of Strained Si/SiGe Heterojunction FinFETs", pp. 176-177.
B. Jin et al., "Mobility Enhancement in Compressively Strained SiGe Surface Channel PMOS Transistors with Hf02/TiN Gate Stack", Proceedings of the First Joint International Symposium, 206th Meeting of Electrochemical Society, Oct. 2004, pp. 111-122.
R. Chau, "Advanced Metal Gate/High-K Dielectric Stacks for High-Performance CMOS Transistors", Proceedings of AVS 5th International Conference of Microelectronics and Interfaces, Mar. 2004, (3 pgs.).
T. Ludwig et al., "FinFET Technology for Future Microprocessors" 2003 IEEE, pp. 33-34.
Peter A. Stolk et al. "Modeling Statistical Dopant Fluctuations in MOS Transistors", 1998 IEEE, IEEE Transactions on Electron Devices, vol. 45, No. 9, Sep. 19987, pp. 1960-1971.
Evert Seevinck et al., "Static-Noise Margin Analysis of MOS SRAM Cells" 1987 IEEE, IEEE Journals of Solid-State Circuits, vol. SC-22, No. 5, Oct. 1987.
Yang-Kyu Choi et al. "Sub-20nm CMOS FinFET Technologies", IEEE 2001, IEDM 01-421 to 01-424.
M. Ieong et al. "Three Dimensional CMOS Devices and Integrated Circuits", IEEE 2003, CICC, San Jose, CA, Sep. 21-24, 2003, pp. 207-214.
E.J. Nowak et al., "Scaling Beyond the 65nm Node with FinFET-DGCMOS", IEEE 2003, CICC, San Jose, CA, Sep. 21-24, 2003, pp. 339-342.
E.C. Jones, "Doping Challenges in Exploratory Devices for High Performance Logic", 14$^{th}$ International Conference, Piscataway, NJ, Sep. 22-27, 2002, pp. 1-6.
T. Park et al. "PMOS Body-Tied FinFET (Omega MOSFET) Characteristics", Device Research Conference, Piscataway, NJ, Jun. 23-25, 2003, IEEE, pp. 33-34.
E.J. Nowak et al., "A Functional FinFET-DGCMOS SRAM Cell", International Electron Devices Meeting 2002, San Francisco, CA, Dec. 8-11, 2002, pp. 411-414.

Jae-Hyoun Park, "Quantum-wired MOSFET Photodetector Fabricated by Conventional Photolithography on SOI Substrate", Nanotechnology, 2004, 4$^{th}$ IEEE Conference on Munich, Germany, Aug. 16-19, 2004, Piscataway, NJ, pp. 425-427, XP010767302.
L. Chang et al. "CMOS Circuit Performance Enhancement by Surface Orientation Optimization" IEEE Transactions on Electron Devices, IEEE Service Center, Piscataway, NJ vol. 51, No. 10, Oct. 2004, pp. 1621-1627 XP001211140.
M. Stadele et al., "A Comprehensive Study of Corner Effects in Tri-gate Transistors", IEEE 2004, pp. 165-168.
Ali Javey et al., "Ballistic Carbon Nanotube Field-Effect Transistors", Nature, vol. 424, Aug. 7, 2003, pp. 654-657.
Lide, David R. "Properties of Semiconductors" CRC Handbook of Chemistry and Physics, internet version 2007, (87th edition), David R. Lide—Editor; Taylor and Francis, pp. 12-77-12-89.
T. M. Mayer, et al., "Chemical Vapor Deposition of Fluoroalkylsilane Monolayer Films for Adhesion Control in Microelectromechanical Systems" 2000 American Vacuum Society B 18(5), Sep.-Oct. 2000, pp. 2433-2440.
R. Chau et al., Advanced Depleted-Substrate Transistors: Single-Gate, Double-Gate and Tri-gate (Invited Paper), Components Research, Logic Technology Development, Intel Corporation, Hillsboro OR, 2 pages.
Ashley, T , et al., "High-Speed, Low-Power InSb Transistors", *IEDM 97*, pp. 751-754.
Ashley, et al., "Novel InSb-based Quantum Well Transistors for Ultra-High Speed, Low Power Logic Applications", *Solid-State and Integrated Circuits Technology, 7th International Conference on*, Beijing 2004, IEEE vol. 3, 4 Pages.
Balakrishnan, G. , et al., "Room-Temperature Optically-Pumped InGaSb Quantum Well Lasers Monolithically Grown on Si (100) Substrate", *IEE 2005*, 2 pages, (Feb. 12, 2005).
Bednyi, et al., "Electronic State of the Surface of INP Modified by Treatment in Sulfur Vapor", Bednyi, et al., "*Electronic State of the Surface of INP Modified by Treatment in Sulfur Vapor*", Soviet Physics Semiconductors, Am. Inst. of Physics, New York, vol. 26, No. 8, Aug. 1, 1992, (Aug. 1, 1992).
Bessolov, V N., et al., "Chalcogenide passivation of III-V semiconductor surfaces", *Semiconductores*, vol. 32, Nov. 1998, pp. 1141-1156.
Datta, et al., "85nm Gate Length Enhancement and Depletion Mode In—Sb Quantum Well Transistors for Ultra High Speed and Very Low Power Digital Logic Applications", Datta, et al., "*85nm Gate Length Enhancement and Depletion Mode InSb Quantum Well Transistors for Ultra High Speed and Very Low Power Digital Logic Applications*", IEEE Dec. 5, 2005, pp. 763-766, (Dec. 5, 2005).
Frank, et al., "*HfO2 and Al2O3 Gate Dielectrics on GaAs Grown by Atomic Layer Deposition*", Appl. Phys. Lett., vol. 86, No. 15, pp. 152904-4-152904-3.
Gonzalez, C , et al., "Selenium passivation of GaAs(001): a combined experimental and theoretical study", *J. Phys. Condens. Matter 16*, 2004, pp. 2187-2206.
Jang, H.W. , et al., "Incorporation of Oxygen Donors in AlGaN", Jang, H.W., "*Incorporation of Oxygen Donors in AlGaN*", J. Electrochem Soc 152, pp. G536-G540,
Mistele, D , et al., "Incorporation of Dielectric Layers into the Porcessing of III-Nitride-Based Heterosructure Field-Effect Transistors", *Journal of Electronic Materials*, vol. 32, No. 5, 2003, 9 Pages.
Mori, M. , et al., Heteroepitaxial Growth of InSb on a Si (0 0 1), Substrate via AlSb Buffer Layer , *Applied Surface Science* 216 (2003), 6 pages, 569-574.
Park, K.Y. et al., "Device Characteristics of AlGaN/GaN MIS-HFET Using A/203-HfO3 Laminated High-k Dielectric", Park, K.Y. et al., *Device Characteristics of AlGaN/GaN MIS-HFET Using A/203-HfO3 Laminated High-k Dielectric, Japan Journ of Appl.Phy.* vol. 43, 2004, pp. L1433-L1435, (2004).
Passlack, Matthias, et al., "Self-Aligned GaAs p-Channel Enhancement Mode MOS Heterostructure Field-Effefct Transistor", *IEEE Electron Device Letters*, vol. 23, No. 9, Sep. 2002, 3 Pages.
Scholz, S. et al., "MOVPE growth of GaAs on Ge substrates by inserting a thin temperature buffer layer", *Cryst. Res. Technol. 41*, No. 2, (2006), 6 pages, (Jan. 15, 2006), 111-116.

(56) References Cited

OTHER PUBLICATIONS

Sieg, R. M., et al., "Toward device-quality GaAs growth by molecular beam epitaxy on offcut Ge/Si_Ge/Si substrates", *J. Vac. Sci. Technol. B*, vol. 16, No. 3, May/Jun. 1998. 4 pages, 1471-1474.

Wan, A., et al., "Characterization of GaAs grown by molecular beam epitaxy on vicinal Ge(100) substrates", *J. Vac. Sci. Technol. B*, vol. 22, No. 4, Jul./Aug. 2004, 6 pages, (Jul. 27, 2004), 1893-1898.

Breed, A., et al., "Dual-gate (FinFET) and tri-gate MOSFETs: simulation and design", Semiconductor Device Research Symposium, 2003 International, Dec. 10-12, 2003, pp. 150-151.

Buchanan, D. A., et al., "Fabrication of Midgap Metal Gates Compatible with Ultrathin Dielectrics," Applied Physics Letters, 73.12, (Sep. 21, 1998), pp. 1676-1678.

Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.

Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.

Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), pp. 568-570.

Nackaerts et al., "A 0.314μm² 6T-SRAM Cell build with Tall Triple-Gate Devices for 45nm node applications using 0.75NA 193nm lithography," IDEM, (Dec. 13, 2004), pp. 269-272.

Nowak, Edward J. et al., "Turning Silicon on Its Edge . . . ," IEEE Circuits & Devices Magazine, vol. 1, (Jan./Feb. 2004), pp. 20-31.

Park, Donggun et al., "3-Dimensional nano-CMOS Transistors to Overcome Scaling Limits," IEEE 2004, ISBN 0-7803-8511-X, (Oct. 18, 2004), pp. 35-40.

Park, Jong-Tae, et al., "Pi-Gate SOI MOSFET". IEEE Electron Device Letters, vol. 22, No. 8, Aug. 2001, pp. 405-406.

Sugizaki, T. et al., "Novel Multi-bit SONOS Type Flash Memory Using a High-k Charge Trapping Layer," VLSI Technology, 2003, Digest of Technical Papers, Symposium on, Jun. 10-12 2003, pp. 27-28.

Tang, Stephen H. et al., "FinFET—A quasi-planar double-gate MOSFET", 2001 IEEE International Solid-State Circuits Conference (Feb. 6, 2001), pp. 1-3.

Tokoro, Kenji et al., "Anisotropic Etching Properties of Silicon in KOH and TMAH Solutions," International Symposium on Micromechatronics and Human Science, IEEE (1998), pp. 65-70.

Wolf, Stanley et al., "Wet Etching Silicon," Silicon Processing for the VLSI Era, vol. 1: Process Technology, Lattice Press, Sunset Beach, CA, (Sep. 1986), (3 pgs.).

Wang, X., et al., "Band alignments in sidewall strained Si/strained SiGe heterostructures", (May 28, 2002), 1-5.

Yang, Fu-Liang et al., "25nm CMOS Omega FETs" IEEE 2002, 10.3.1-10-.3.4, pp. 255-258.

J.P.Colinge, J.T.Park and C.A.Colinge, "SOI devices for sub-0.1 μm gate lengths", Proc. 23rd International Conference on Microelectronics (MIEL 2002), May 12, 2002, vol. 1, pp. 109-113.

"FinFET—A quasi-Planar Double-Gate MOSFET" by Stphen H. Tang et al., Department of Electrical Engineering and Computer Sciences, Univeristy of Claifornia at Berkeley, California, *ISCC 2001*.

Auth, Christopher P., et al., Vertical, *Fully-Depleted, Surrounding Gate MOSFETs on sub-0.1 um Thick Silicon Pillars*, 54th Annual Device Research Conference Digest, 1996, 2 pgs.

Bednyi, et al., "Electronic State of the Surface of INP Modified by Treatment in Sulfur Vapor", *Soviet Physics Semiconductors, Am. Inst. of Physics*, New York, vol. 26, No. 8, Aug. 1, 1992.

Buchanan, D. A., et al., *Fabrication of Midgap Metal Gates Compatible With Ultrathin Dielectrics, Applied Physics Letters*, vol. 73.12, Sep. 21, 1998, 3 pgs.

Burenkov, A., et al., Corner *Effect in Double and Triple Gate FinFETs, European Solid-State Device Research 2003, 33rd Conference on ESSDERC*, 4pgs.

Chang, L., et al., *CMOS Circuit Performance Enhancement by Surface Orientation Optimization, IEEE Transactions on Electron Devices*, vol. 51, No. 10, Oct. 2004, 7 pgs.

Chang, S. T., et al., *3-D Simulation of Strained Si/SiGe Heterojunction FinFets, Semiconductor Device Research Symposium*, Dec. 2003, 2 pgs.

Chau, Robert, *Advanced Metal Gate/High-K Dielectric Stacks for High-Performance CMOS Transistors, Components Research*, Intel Corporation, 2004, 3 pgs.

Chau, R., et al., "Advanced Depleted-Substrate Transistors: Single-Gate, Double Gate and Tri-gate (Invited Paper)", *2002 International Conference on Solid State Devices and Materials (SSDM 2002)*, Nagoya, Japan Sep. 17, 2002, Components Reserach, Logic Technolgoy Development, Intel Corporation, Hillsboro, OR, 2 pages.

Choi, Yang-Kyu, et al., A *Spacer Patterning Technology for Nanoscale CMOS, IEEE, (49)3, XP-001102694*, Mar. 2002, 6 pgs.

Choi, Yang-Kyu, et al., Sub-*20nm CMOS FinFET Technologies, IEEE, IEDM*, 2001, 4 pgs.

Claflin, B., et al., Interface *Studies of Tungsten Nitride and Titanium Nitride Composite Metal Gate Electrodes With Thin Dielectric Layers*, Journal of Vacuum Science and Technology A 16.3, May/Jun. 1998, 5 pgs.

Collaert, N., et al., *A Functional 41-stage ring oscillator using scaled FinFET devices with 25-nm gate lengths and 10-nm fin widths applicable for the 45-nm CMOS node, IEEE Electron Device Letters*, vol. 25, No. 8, Aug. 2004, 3 pgs.

Frank, et al., "*HfO2 and Al2O3 Gate Dielectrics on GaAs Grown by Atomic Layer Deposition*", *Appl. Phys. Lett.*, vol. 86, No. 15, pp. 152904-4-152904-3, 2005.

Fried, David M., et al., Improved *Independent Gate N-Type FinFET Fabrication and Characterization, IEEE 24(9)*, Sep. 2003, 3 pgs.

Fried, David M., et al., High-*Performance P-Type Independent-Gate FinFETs, IEEE 25(4)*, 2004, 3 pgs.

Gonzalez, C, et al., "Selenium passivation of GaAs(001): a combined experimental and theoretical study", *J. Phys. Condens. Matter 6*, 2004, pp. 2187-2206.

Guo, Jing, et al., Performance *Projections for Ballistic Carbon Nanotube Field-Effect Transistors, Applied Physics Letters 80(17)*, Apr. 29, 2002, 3 pgs.

Hisamoto, Digh, et al., *A Fully Depleted Lean-Channel Transistor (DELTA)-A Novel Vertical Ultrathin SOI MOSFET, IEEE Electron Device Letters*, V. 11 (1), 1989, 4 pgs.

Hisamoto, Digh, et al., *A Folded-Channel MOSFET for Deepsub-tenth Micron Era, 1998 IEEE International Electron Device Meeting Technical Digest*, 3 pgs.

Hisamoto, Digh, et al., *FinFET—A Self-Aligned Double-Gate MOSFET Scalable to 20nm, IEEE Transactions on Electron Devices*, vol. 47, No. 12, Dec. 2000, 6 pgs.

Hisamoto, Digh, et al., "A Folded-channel MOSFET for Deep-sub-tenth Micron Era", IEEE, (1998), 15.7.1-15.7.3.

Huang, Xuejue, et al., "Sub 50 nm FinFET: PMOS", *1999 IEEE International Electron Device Meeting Technical Digest*, (1999), pp. 67-70.

Hwang, Jeong-Mo, et al., *Novel Polysilicon/Tin Stacked-Gate Structure for Fully-Depleted SOI/CMOS, International Electronic Devices Meeting Technical Digest*, 1992, 4 pgs.

Ieong, M., et al., *Three Dimensional CMOS Devices and Integrated Circuits, IEEE CICC*, San Jose CA Sep. 21-24, 2003 8 pgs.

Jang, H.W., et al. "Incorporation of Oxygen Donors in AlGaN", *Jang, H.W., "Incorporation of Oxygen Donors in AlGaN", J. Electrochem Soc 152*, pp. G536-G540, (2004).

Javey, Ali, et al., *Ballistic carbon nanotube field-effect transistors, Nature*, vol. 424, Aug. 7, 2003, 4 pgs.

Javey, Ali, et al., *High-k dielectrics for advanced carbon-nanotube transistors and logic gates*, www.nature.com/naturematerials.com, 2002, 6 pgs.

Jin, B., *Mobility Enhancement in Compressively Strained Sige Surface Channel PMOS Transistors with HFO2/TIN Gate Stack, Components Research*, Intel Corporation, Oct. 2004, 12 pgs.

Jones, E. C., et al., *Doping Challenges in Exploratory Devices for High Performance Logic, 14th Int'l Conference*, Piscataway, NJ, Sep. 22-27, 2002, 6 pgs.

(56) References Cited

OTHER PUBLICATIONS

Kim, Sung M., et al., *A Novel Multi-channel Field Effect Transistor (McFET) on Bulk Si for High Performance Sub-80nm Application*, IEEE2004, 4 pgs.
Kuo, Charles, et al., *A Capacitorless Double-Gate DRAM Cell Design for High Density Applications*, IEEE2002, 4 pgs.
Kuo, Charles, et al., "A Capacitorless Double Gate DRAM Technology for Sub-100-nm Embedded and Stand-Alone Memory Applications", IEEE 50(12):, (2003), 2408-2416.
Lide, David R., "Properties of Semiconductors", *CRC Handbook of Chemistry and Physics, Internet version 2007, (87th edition)*, David R. Lide—Editor; Taylor and Francis., pp. 12-77-12-89.
Ludwig, et al., FinFET *Technology for Future Microprocessors*, *IEEE Int'l. SOI Conference*, New Port Beach, CA, Sep. 29-Oct. 2, 2003, 2 pgs.
Maeda, Shigenobu, et al., "Negative Bias Temperature Instability in Triple Gate Transistors", *Proceedings of the 42nd Annual International Reliability Physics Symposium*, 2004, (Apr. 25-29, 2004), pg. 8.
Martel, Richard, et al., "Carbon Nanotube Field Effect Transistors for Logic Applications", *IEEE 2001*, 4 pgs.
Mayer, T. M., et al., "Chemical Vapor Deposition of Flouroalkylsilane Monolayer Films for Adhesion Control in Microelectromechanical Systems", *J. Vac. Sci. Technol. B. 18(5)*, 2000, 8 pgs.
Mori, M., et al., "Heteroepitaxial Growth of InSb on a Si (0 0 1) Substrate Via AlSb Buffer Layer", *Applied Surface Science 216 (2003)*, 6 pages, 569-574.
Nackaerts, et al., "A 0.314um2 6T-SRAM Cell build with Tall Triple-Gate Devices for 45nm node applications using 0.75NA 193nm lithography", *IEEE*, 2004, 4 pgs.
Nowak, E. J., et al., "A Functional FinFET-DGCMOS SRAM Cell", *Int'l. Electron Devices Meeting*, San Francisco, CA Dec. 8-11, 2002, 4 pgs.
Nowak, E. J., et al., "Scaling Beyond the 65 nm Node with FinFET-DGCMOS", *IEEE CICC*, San Jose, CA Sep. 21-24, 2003 4 pgs.
Nowak, Edward J., et al., "Turning Silicon on Its Edge", *IEEE Circuits & Devices Magazine* vol. 1, Jan./Feb. 2004, 12 pgs.
Ohsawa, Takashi, et al., "Memory Design Using a One-Transistor Gain Cell on SOI", *IEEE 37(11)*, Nov. 2002, 13 pgs.
Park, Jae-Hyoun, et al., *Quantum-Wired MOSFET Photodetector Fabricated by Conventional Photolighography on SOI Substrate*, *Nanotechnology, 4th IEEE Conference on Munich*, Germany, Aug. 16-19, 2004 Piscataway, NJ, 3 pgs.
Park, Donggun, et al., *3-dimensional nano-CMOS Transistors to Overcome Scaling Limits, IEEE 2004*, ISBN 0-7803-8511-X, 6 pgs.
Park, K.Y., et al., "Device Characteristics of AlGaN/GaN MIS-HFET Using A/2O3-HFO3 Laminated High-k Dielectric", *Japan Journ of Appl.Phys.* vol. 43, 2004, pp. L1433-L1435, (2004).
Park, T., et al., "Fabrication of Body-Tied FinFETs (Omega MOSFETs) Using Bulk Si Wafers", *2003 Symposium on VLSI Technology Diciest of Technical Papers*, 2 pgs., pp. 135-136.
Park, T., et al., "Fabrication of Body-Tied FinFETs (Omega MOSFETS) Using Bulk Si Wafers", *2003 Symposia on VLSI Technology Digest of Technical Papers*, (Jun. 2003), pp. 135-136.
Park, Jong-Tae, et al., "Pi-Gate SOI MOSFET", *IEEE Electron Device Letters*, vol. 22, No. 8, Aug. 2001, 2 pgs.
Park, T., et al., "PMOS Body-Tied FinFET (Omega MOSFET) Characteristics", *IEEE Device Research Conference*, Piscataway, NJ, Jun. 23-25, 2003, 2 pgs.
Passlack, Matthias, et al., "Self-Aligned GaAs p-Channel Enhancement Mode MOS Heterostructure Field-Effefct Transistor", *IEEE Electron Device Letters*, vol. 23, No. 9, Sep. 2002, 3 Pages.
Seevinck, Evert, et al., *Static-Noise Margin Analysis of MOS SRAM Cells, IEEE, Journal of Solid-State Circuits, (SC-22)5*, Oct. 1987, 7 pgs.
Stadele, M., et al., A*Comprehensive Study of Corner Effects in Trigate Transistors, IEEE 2004*, 4 pgs.
Stolk, Peter A., et al., Device *Modeling Statistical Dopant Fluctuations in MOS Transistors, IEEE Transactions on Electron Devices*, (45)9, 1997, 4 pgs.
Subramanian, V., "A Bulk-Si-Compatible Ultrathin-body SOI Technology for Sub-100m MOSFETS", *Proceeding of the 57th Annual Device Research Conference*, (1999), pp. 28-29.
Sugizaki, T., et al., Novel *Multi-bit SONOS Type Flash Memory Using a High-k Charge Trapping Layer, VLSI Technology, 2003. Digest of Technical Papers. Symposium on 10-12*, Jun. 2003, 2 pgs.
Tanaka, T., et al., Scalability *Study on a Capacitorless IT-DRAM: From Single-gate PD-SOI to Double-gate FinDRAM, IEEE*, 2004, 4 pgs.
Tokoro, Kenji, et al., Anisotropic *Etching Properties of Silicon in KOH and TMAH on Solutions, International Symposium on Micromechatronics and Human Science, IEEE*, 1998, 6 pgs.
Wan, A., et al., "Characterization of GaAs grown by molecular beam epitaxy on vicinal Ge(100) substrates", *J. Vac. Sci. Technol. B, vol. 22, No. 4, Jul./Aug. 2004, 6 pages*, (Jul. 27, 2004), 1893-1898.
Wolf, Stanley, et al., Silicon *Processing for the VLSI Era, vol. 1: Process Technology, Lattice Press*, Sep. 1986, 3 pgs.
Xiong, W., et al., Corner *Effect in Multiple-Gate SOI MOSFETs*, *IEEE*, 2003, 3 pgs.
Xiong, Weize, et al., Improvement *of FinFET Electrical Characteristics by Hydrogen Annealing, IEEE Electron Device Letters, 25(8)*, Aug. 2004, 3 pgs.
Yang, Fu-Liang, et al., 5nm-*Gate Nanowire FinFET, IEEE*, 2004, 2 pgs.
Collaert, N., et al., A Functional 41-stage ring oscillator using scaled FinFET devices with 25-nm gate lengths and 10-nm fin widths applicable for the 45-nm CMOS node, IEEE Electron Device Letters, vol. 25, No. 8, Aug. 2004, 3 pgs.
Park, Donggun, et al., 3-dimensional nano-CMOS Transistors to Overcome Scaling Limits, IEEE 2004, ISBN 0-7803-8511-X, 6 pgs.
Subramanian, V., "A Bulk-Si-Compatible Ultrathin-body SOI Technology for Sub-100m MOSFETS", Proceeding of the 57th Annual Device Research Conference, (1999), pp. 28-29.
Tang, Stephen H., et al., FinFET—A Quasi-Planar Double-Gate MOSFET, IEEE International Solid-State Circuits Conference, Feb. 6, 2001, 3 pgs.
Tokoro, Kenji, et al., Anisotropic Etching Properties of Silicon in KOH and TMAH Solutions, International Symposium on Micromechatronics and Human Science, IEEE, 1998, 6 pgs.
Wang, X., et al., "Band alignments in sidewall strained Si/strained SiGe heterostructures", (May 28, 2002), 1-5.
Doyle, B. et al.: Tri-Gate Fully Depleted CMOS Transistors: Fabrication, Design and Layout. In: Symposium on VLSI Technology Digest of Technical Papers 2003, 2003, 133.
Doyle, B.S. et al.: High Performance Fully-Depleted Tri-Gate CMOS Transistors. In: IEEE Electron Device Letters, 24, 2003, 4, 263.
Colinge, J.P. et al.: Threshold Voltage and Subthreshold Slope of Multiple-Gate SOI MOSFETs. In: IEEE Electron Device Letters, 24, 2003, 8, 515.
Fossum, J.G. et al.: Suppression of Corner Effects in Triple-Gate MOSFETs. In: IEEE Electron Device Letters, 24, 2003, 12, 745.

\* cited by examiner

FIELD EFFECT TRANSISTOR WITH NARROW BANDGAP SOURCE AND DRAIN REGIONS AND METHOD OF FABRICATION

RELATED APPLICATIONS

This application is a continuation of U.S. patent application Ser. No. 14/465,636, filed Aug. 21, 2014, which is a continuation of U.S. patent application Ser. No. 14/137,804, filed Dec. 20, 2013, now U.S. Pat. No. 8,816,394, which is a continuation of U.S. patent application Ser. No. 13/752,272, filed Jan. 28, 2013, now U.S. Pat. No. 8,664,694, which is a continuation of U.S. patent application Ser. No. 13/453,403 filed on Apr. 23, 2012, now U.S. Pat. No. 8,368,135, which is a continuation of U.S. patent application Ser. No. 13/021,640 filed on Feb. 4, 2011, now issued as U.S. Pat. No. 8,183,646, which is a divisional of U.S. patent application Ser. No. 12/850,582 filed on Aug. 4, 2010, now issued as U.S. Pat. No. 7,893,506, which is a continuation of U.S. patent application Ser. No. 12/343,400 filed on Dec. 23, 2008, now issued as U.S. Pat. No. 7,825,481, which is a divisional of U.S. patent application Ser. No. 11/064,996 filed on Feb. 23, 2005, now issued as U.S. Pat. No. 7,518,196.

BACKGROUND OF THE INVENTION

1. Field of the Invention

The present invention relates to the field of field effect transistors and more particularly to a field effect transistor having a pair of source/drain regions formed from a narrow bandgap semiconductor film and its method of fabrication.

2. Discussion of Related Art

Integrated circuits, such as microprocessors, digital signal processors, and memory devices are made up of literally millions of transistors coupled together into functional circuits. An example of a conventional metal oxide semiconductor field effect transistor (MOSFET) 100 is illustrated in FIG. 1. Transistor 100 includes a gate electrode 102 formed on a gate dielectric layer 104 which in turn is formed on a monocrystalline silicon substrate. A pair of sidewall spacers 108 are then formed along laterally opposite sidewalls of the gate electrode 102. A pair of source/drain regions 110 are then formed along opposite sides of the gate electrode 102 as shown in FIG. 1. The source and drain regions comprise heavily doped portions of the silicon substrate 106. Typically, a silicide layer 112, such as titanium silicide or nickel silicide, is used to couple contacts 120 formed in a interlayer dielectric 140 to the source and drain regions 110. Silicide regions 112 are generally formed by alloying a metal, such as titanium, nickel or cobalt with the silicon substrate 106 to form the metal silicide. Additionally, contacts 120 are generally formed from a relatively high resistance film such as tungsten which can be conformally deposited so that it fills contact opening formed in the into dielectric layer 140.

The dimension of transistor 100 are continually being scaled down in order to increase packing density and thereby increase the computational power of the fabricated integrated circuits. Unfortunately, as transistor 100 is continually scaled down, the external resistance of the device (Rext) is increased degrading device performance, such as its drive current. Presently, the problem of increased Rext is solved by high active doping of the source and drain region and fully siliciding the source and drain regions. High active doping of the source and drain regions can decrease the electron mobility in the source and drain regions. Fully siliciding the source and drain regions results in a schkotty barrier transistors resulting in ambipolar conduction. Additionally, formation of silicide films by alloying a metal and the semiconductor substrate together can increase the thermal budget of the device which can decrease device performance.

DETAILED DESCRIPTION OF THE PRESENT INVENTION

The present invention is a field effect transistor having a pair of source/drain regions formed from a narrow bandgap semiconductor film. In the following description numerous specific details are set forth in order to provide a thorough understanding of the present invention. In other instances, well known semiconductor processing techniques and equipment have not been forth in particular detail in order to not unnecessarily obscure the present invention.

Embodiments of the present invention include a field effect transistor having a pair of source/drain regions formed from a narrow energy bandgap (e.g., less than 0.75 eV) semiconductor film. In an embodiment of the present invention, the silicon substrate adjacent to the gate electrode is etched out and refilled with a selective epitaxial regrowth of a narrow bandgap high mobility compound semiconductor material. By forming the source and drain regions from a narrow bandgap high conductivity semiconductor, such as indium antimonide (InSb), indium arsenide (InAs), indium gallium arsenide ($In_{1-x}Ga_xAs$(x>50%)) and indium phosphide (InP), a significant reduction in the parasitic series resistance in extremely scaled sub-50 nanometer MOSFETs can be obtained. Additionally, in embodiments of the present invention, non-alloyed ohmic contacts are used to make contact to the narrow bandgap semiconductor film which results in a very low thermal budget in the front end process thereby improving device performance. Additionally, in embodiments of the present invention, the transistor is formed in a thin silicon layer of silicon-on-insulator (SOI) substrate in order to decrease or remove the possibility of increased junction leakage current. Source and drain regions formed from a narrow bandgap semiconductor material can be used to decrease the parasitic resistance in both planar and nonplanar devices.

Figure 1:
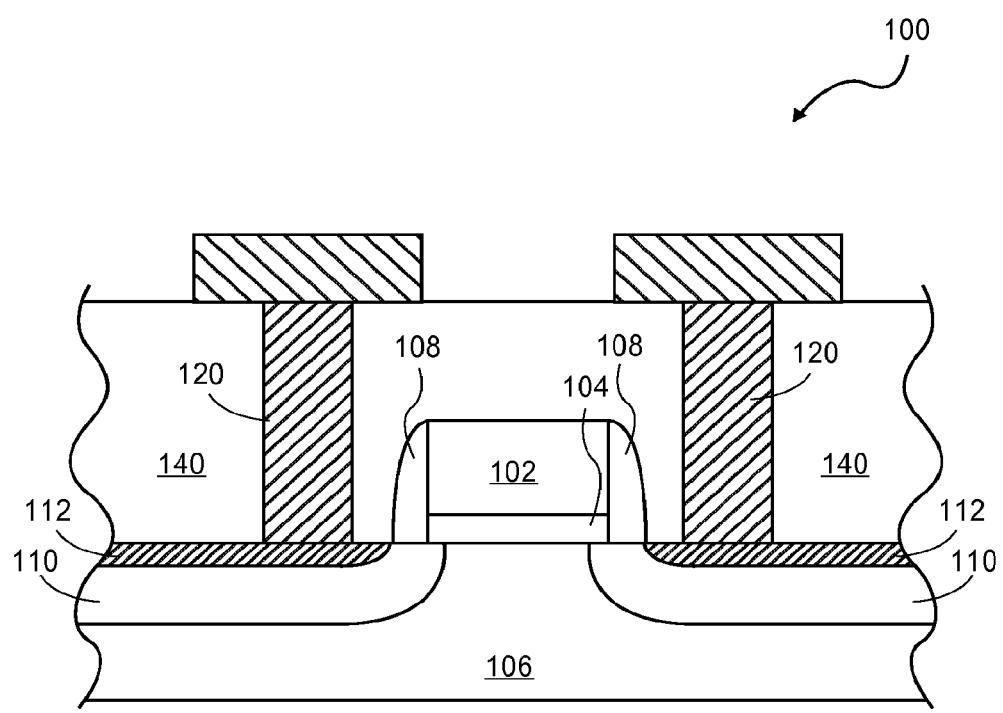
FIG. 1 is an illustration of a cross-sectional view of a standard MOS nonplanar field effect transistor.
Figure 2A:
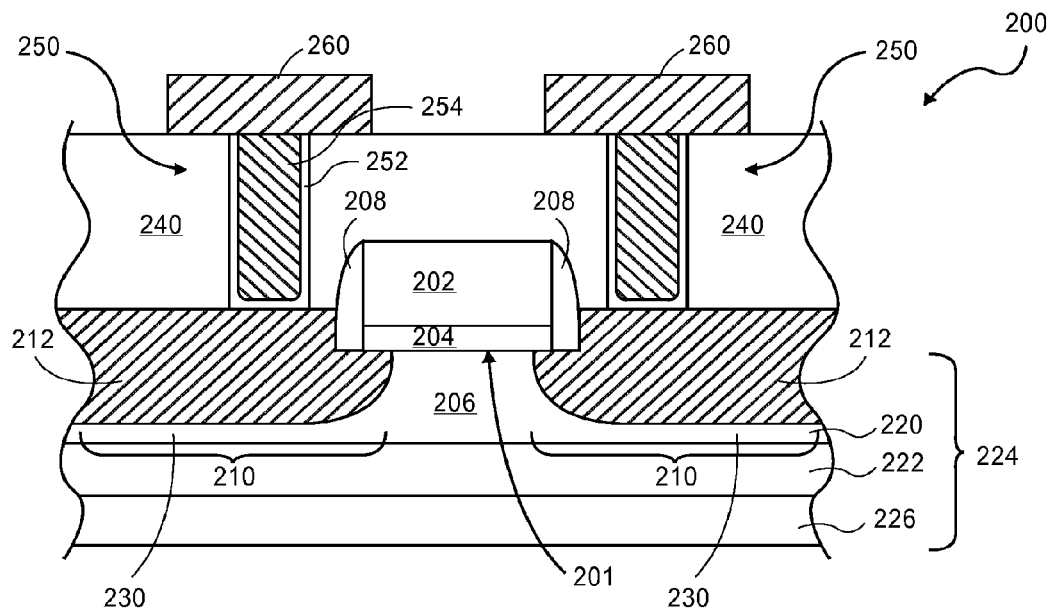
FIGS. 2A and 2B are illustrations of cross-sectional views of nonplanar field effect transistors having a pair of source/drain regions formed from a narrow bandgap semiconductor in accordance with embodiments of the present invention.

FIG. 2A is an example of a metal oxide semiconductor field effect transistor (MOSFET) 200 in accordance with an embodiment of the present invention. Transistor 200 has a gate electrode 202 formed on a gate dielectric layer 204 formed on a silicon layer 206. A pair of sidewall spacers 208 are formed along laterally opposite sidewalls of gate electrode 202 as shown in FIG. 2A. Transistor 200 has a pair of source/drain regions 210 formed on opposite sides of gate electrode 202. A channel region 206 is located in the silicon layer between the source and drain regions 210.

Figure 4:
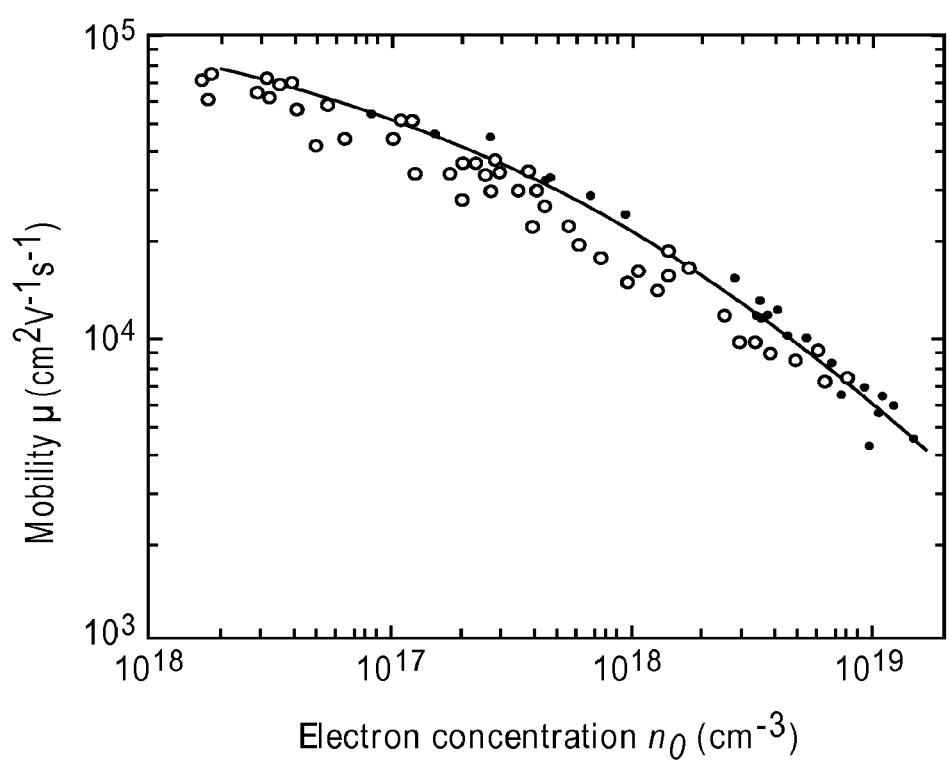
FIG. 4 is a plot showing the electron mobility verses sheet carrier concentration for indium antimonide (InSb).

In an embodiment of the present invention, the source and drain regions 210, or a portion of the source and drain regions 210, are formed from a low or narrow bandgap energy semiconductor film 212. In an embodiment of the present invention the narrow bandgap semiconductor is an epitaxial or single crystalline film. In an embodiment of the present invention, the source and drain regions 210 are formed from a narrow bandgap semiconductor 212 having an energy bandgap of less than 0.75 eV and in embodiments less than 0.36 eV. In an embodiment of the present invention, the narrow bandgap semiconductor film 212 is a compound semiconductor film having a bandgap between 0.75 eV and 0.18 eV. In an embodiment of the present invention, the source and drain regions 210 include a epitaxial narrow bandgap, high mobility compound semiconductor material 212, such as but not limited to indium antimonide (InSb), indium arsenide (InAs), indium gallium arsenide ($In_{1-x}Ga_xAs(x>50\%)$) and indium phosphide (InP). In an embodiment of the present invention, the source and drain region 210 are formed from a compound semiconductor 212 having bulk mobility between 10,000-80,000 $\mu(cm^2V^{-1}s^{-1})$. An advantage of using a narrow bandgap semiconductor in the source and drain regions, is that they have low sheet resistivities due to their inherently high mobilities and superior electron transport properties as compared to silicon. FIG. 4 is a plot which illustrates the electron mobility in InSb vs. the carrier concentration. The higher mobility results in a low sheet resistance ($R_{sd}$). Another advantage of using a narrow bandgap semiconductor 212 with very high mobility is that it provides a lower band offset, $\emptyset_b$, and a lower effective electron mass (m*) which results in a lowering of the contact resistivity, ρc, which results in a lower contact resistance, $R_c$, compared to conventional n+ implanted silicon source and drain regions with nickel silicide contacts.

In an embodiment of the present invention, transistor 200 has raised source and drain regions. Raised source and drain regions are formed by having the narrow bandgap semiconductor film 212 extend above the top surface 201 of the silicon film upon which the gate dielectric layer 204 is formed. In an embodiment of the present invention, the narrow bandgap semiconductor film 212 of the source and drain regions 210 extends at least 200 Å above the silicon surface 201 and generally between 200-300 Å above the surface 201. The dielectric sidewall spacers 208 isolate the raised portion of the source and drain regions 210 from the gate electrode 202. As such, the spacers 208 are formed to a width sufficient enough to isolate the narrow bandgap semiconductor films from the gate electrode 202 as well as wide enough to reduce the parasitic Miller capacitance which can develop between the raised source and drain regions and the gate electrode 202. Additionally, spacers 208 should not be formed too wide so that current traversal path is increased and packing density decreased. In an embodiment of the present invention, the sidewall spacers are formed from an insulating film, such as silicon nitride or silicon oxide, having a width of between 100-500 Å.

In an embodiment of the present invention, as illustrated in FIG. 2A, the narrow bandgap semiconductor 212 laterally extends completely beneath spacer 208 and slightly extends beneath or undercuts the gate dielectric/gate electrode 204/202. In an embodiment of the present invention, the narrow bandgap semiconductor 212 extends beneath the outside edges of the gate electrode 210 by approximately 50-70 Å.

Additionally, when forming an n type field effect transistor (FET) where the majority carriers are electrons, the narrow bandgap semiconductor is doped to an n type conductivity and when forming a p type field effect transistor where the majority carriers are holes, the narrow bandgap semiconductor 212 is doped to a p type conductivity. A narrow bandgap semiconductor 212, such as indium antimonide (InSb), indium arsenide (InAs), indium gallium arsenide ($In_{1-x}Ga_x$-As(x>50%)) and indium phosphide (InP), can be doped to an n type conductivity with, for example, tellurium (Te), silicon (Si) and sulfur (S) and doped to a p type conductivity with, for example, carbon (C), cadmium (Cd), zinc (Zn) and chromium (Cr).

Figure 2B:
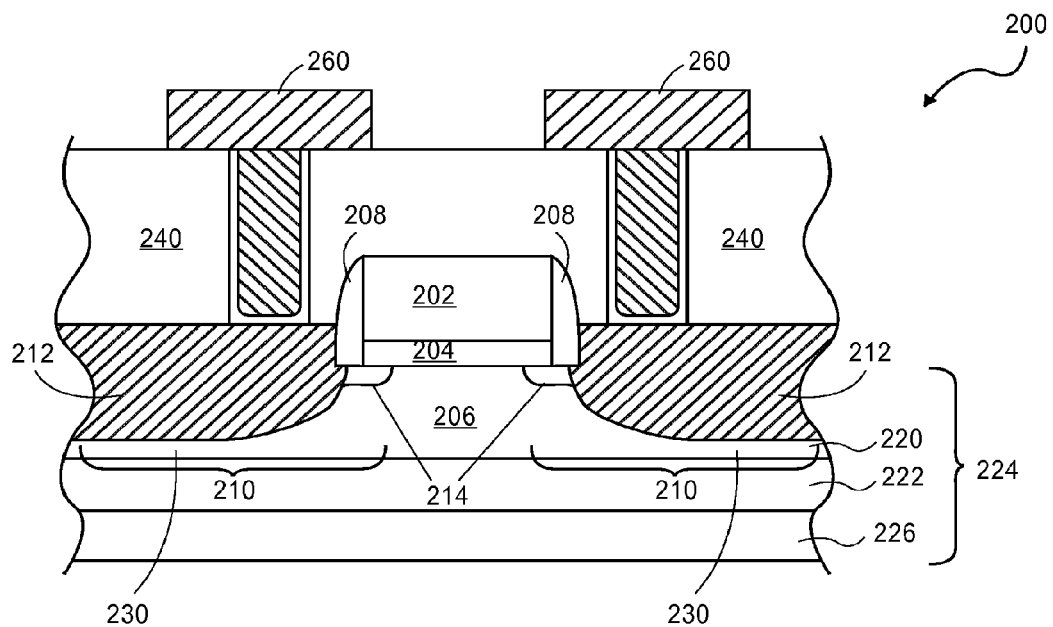

In an embodiment of the present invention, the source and drain regions can include a pair of source/drain extensions or tip regions 214 as illustrated in FIG. 2B. Source/drain extensions are a portion of the source/drain regions 210 and are formed by doping the silicon layer and extend beneath the gate electrode and spacers. The extensions 214 are doped to a p type conductivity for a p type device and to an n type conductivity for a n type device. If the source/drain extensions 214 are provided, then the narrow bandgap semiconductor portion 212 of the source and drain regions 210, need not extend beneath the outside edges of the gate electrode because the laterally tip regions 214 extend the source and drain regions 210 beneath the spacers 208 and gate electrode 202 as shown in FIG. 2B. In an embodiment of the present invention, the narrow bandgap semiconductor 212 extends only slightly beneath the sidewall spacers 208 where it contacts the source/drain extensions 214. In yet another embodiment of the present invention, the narrow bandgap semiconductor 212 contacts the source/drain extensions 214 in alignment with the outside edges of the sidewall spacers 208.

In an embodiment of the present invention, transistor 200 is formed in a silicon layer which is part of a monocrystalline silicon substrate. When transistor 200 is formed in a monocrystalline silicon substrate, the channel region 206 is formed in a doped region of the monocrystalline silicon substrate and the narrow bandgap semiconductor film 210 is formed in recesses formed in the monocrystalline silicon substrate. When a transistor is formed in a monocrystalline silicon substrate, the transistor is sometimes referred to as "a bulk" transistor. Unfortunately, forming the source and drain regions 210 from a low bandgap semiconductor, a bulk device can cause an increase the junction leakage current. Accordingly, in an embodiment of the present invention, in order to reduce the junction leakage current, transistor 200 is formed in a thin epitaxial silicon film 220 of a silicon-on-insulator (SOI) substrate 224. A silicon-on-insulator (SOI) substrate 224 includes a thin silicon film 220 formed on a buried oxide layer 222 which in turn is formed on a monocrystalline silicon substrate 226. In an embodiment of the present invention, the narrow bandgap semiconductor portions 212 of the source and drain regions 210 are formed in recesses formed in the epitaxial silicon film 220 of the SOI substrate 226. In an embodiment of the present invention, a small portion 230 of the epitaxial silicon film 220 remains between the buried oxide layer and the bottom of the narrow bandgap semiconductor 212 so that an epitaxial narrow bandgap semiconductor film can be selectively grown on the epitaxial silicon film 220. In an embodiment of the present invention, the portion 230 of the epitaxial silicon film remaining between the buried oxide layer and the narrow bandgap semiconductor film 212 is between 10-100 Å thick.

Additionally, in an embodiment of the present invention, an interlayer dielectric 240, such as but not limited to a silicon dioxide film or a low k dielectric, such as a fluorine doped silicon dioxide (SiOF), a carbon doped oxide (CDO) or a zeolite dielectric, is formed over and around transistor 200 as shown in FIGS. 2A and 2B. The interlayer dielectric layer 240 isolates transistor 200 from the upper levels of metallization 260 used to interconnect the various transistor 200 formed on substrate 224 into function circuits, such as microprocessors, digital signal processors and memory devices. Metal contacts 250 are formed through the interlayer dielectric and directly contact the narrow bandgap semiconductor material 212 of the source and drain regions 210 to provide electrical connection between the first level of metallization and the source and drain regions 210 as illustrated in FIG. 2A. In an embodiment of the present invention, the metal contacts 250 form a low resistance non-alloyed ohmic contact with a narrow bandgap semiconductor 210. In an embodiment of the present invention, metal contacts 250 comprise a lower titanium adhesion layer 252 and a bulk gold (Au) layer 254. In an embodiment of the present invention, there is no silicide or alloyed films formed between the narrow bandgap semiconductor film 210 and the contact 250. The use of a non-alloyed metal contact 250 results in a very low thermal budget in the front end of the process flow and its associated benefits.

Figure 5:
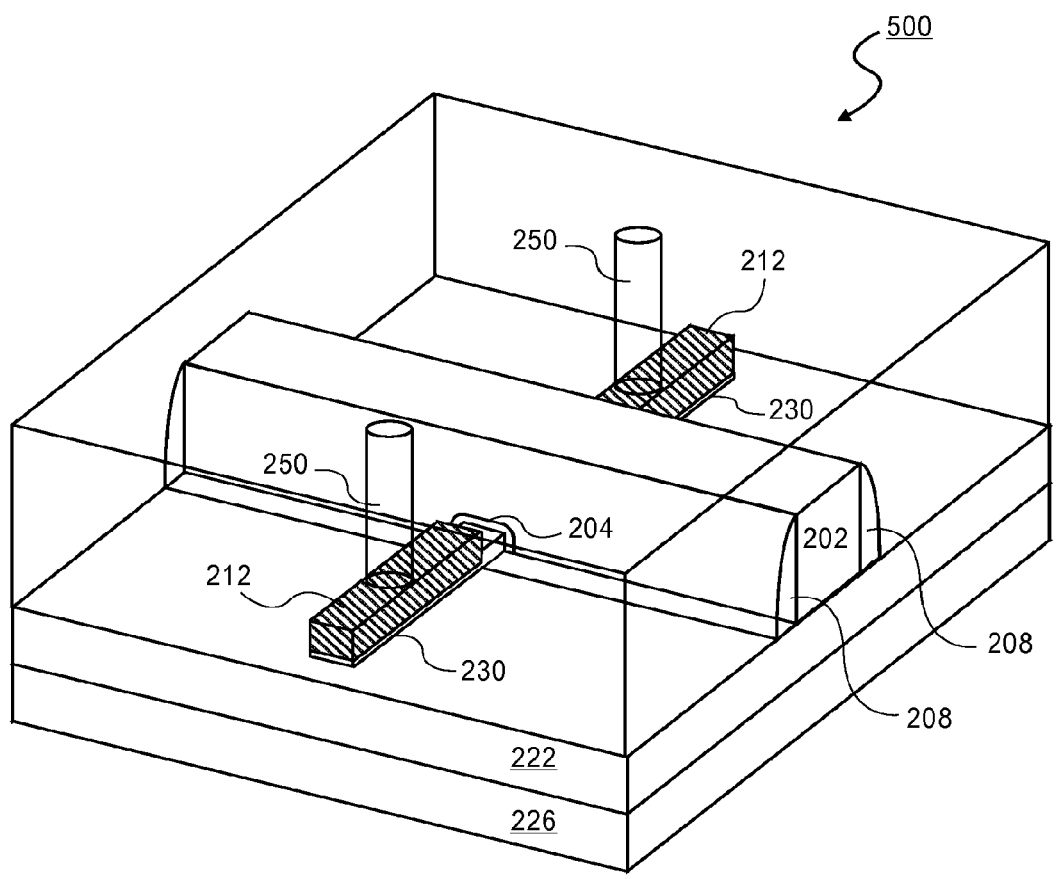
FIG. 5 is an illustration of a nonplanar transistor having a pair of source/drains formed from a narrow bandgap semiconductor.

It is to be appreciated that the present invention is not limited to planar devices and can be used in nonplanar devices, such as tri-gate transistors and dual gate transistors. FIG. 5 illustrates a tri-gate transistor 500 having source and drain regions comprising a narrow bandgap semiconductor film 212. In a nonplanar device, instead of forming the gate dielectric layer 204 on a single surface of a silicon film, the silicon film is first patterned into a silicon body having a top surface opposite a bottom surface formed on buried oxide and a pair of laterally sidewalls as shown in FIG. 5. The gate dielectric layer 204 is then formed on the top surface and sidewalls of the silicon body as shown in FIG. 5. A gate electrode is then formed on the gate dielectric layer on the top surface of a silicon body and directly adjacent to the gate dielectric layer 204 on the sidewalls of the semiconductor body so that the gate electrode 202 surrounds the channel region of the silicon body on three sides. In a FINFET or dual gate device, the gate electrode 202 can be isolated from the silicon body by a thick dielectric layer (not shown) so that the gate only controls two sides of the body. The portion of the silicon body on opposite sides of the gate electrode used to form the source and drain regions can then be partially etched away so that the narrow bandgap semiconductor film 212 can be regrown to form the source and drain regions 210.

Figure 3A:
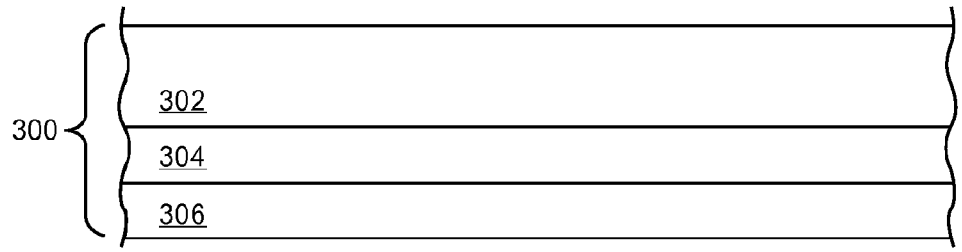
FIGS. 3A-3F illustrate a method of fabricating a field effect transistor having a pair of source/drain regions comprising a narrow bandgap semiconductor in accordance with embodiments of the present invention.

FIGS. 3A-3F illustrate a method of forming a field effect transistor having source and drain regions formed from a narrow bandgap semiconductor film in accordance with embodiments of the present invention. The fabrication of a transistor in accordance with the present invention begins with a substrate. In an embodiment of the present invention, the substrate is a monocrystalline silicon substrate, for example, when forming a bulk semiconductor device. In an embodiment of the present invention, the monocrystalline silicon substrate may include an epitaxial silicon film formed on the monocrystalline substrate as is well known in the art. In yet another embodiment of the present invention, the substrate is a silicon-on-insulator (SOI), such as substrate 300 as illustrated in FIG. 3A. In an embodiment of the present invention, the silicon-on-insulator substrate 300 includes an epitaxial silicon film 302 formed on a buried oxide layer 304 which in turn is formed on a monocrystalline silicon substrate 306. In an embodiment of the present invention, the buried oxide layer has a thickness between 200-2000 Å. Additionally, in an embodiment of the present invention, the epitaxial silicon film or layer 302 has a thickness of between 10-400 Å.

Isolation regions, not shown, are typically formed in the silicon film 302 or substrate adjacent to the device fabrication area to isolate the fabricated transistor from adjacent transistors. The epitaxial silicon film 302 is then doped to a conductivity type and concentration desired for the channel region of the device. In an embodiment of the present invention, when fabricating a p type transistor, the silicon film can be doped to an n type conductivity and when fabricating an n type device the silicon film 302 can be doped to a p type conductivity. Typically, the semiconductor film 302 will be doped to an n type or p type conductivity with a concentration level between $1\times10^{16}$-$1\times10^{19}$ atoms/cm³. In an embodiment of the present invention, the silicon film 302 is left undoped or intrinsic in order to fabricate a transistor with an undoped or intrinsic channel region.

Figure 3B:
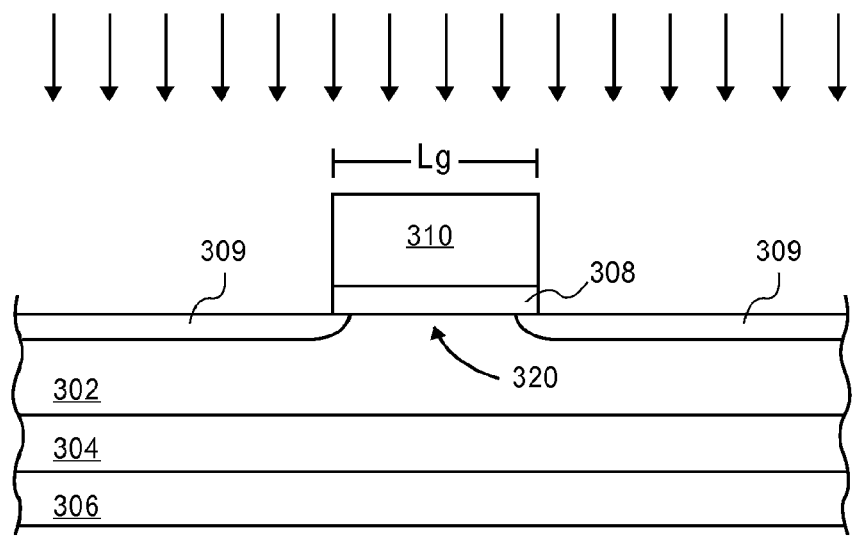

Next, as shown in FIG. 3B, a gate dielectric layer 308 is formed on the epitaxial silicon film 302 and a gate electrode 310 formed on the gate dielectric layer 308. The gate dielectric layer can be a deposited or grown dielectric. In an embodiment of the present invention, the gate dielectric layer is a silicon dioxide or a silicon oxynitride dielectric film grown with a wet/dry oxidation process. In an embodiment of the present invention, the silicon oxide film is grown to a thickness between 5-15 Å. In an embodiment of the present invention, the gate dielectric layer is a deposited dielectric, such as but not limited to a high dielectric constant film (high k), such as a metal oxide dielectric, such as tantalum pentaoxide, titanium oxide, hafnium oxide, zirconium oxide, aluminum oxide, and various silicates or other high k dielectric, such lead zirconium titanate (PZT) and barium strontium titanate (BST). A high dielectric constant film can be formed by any well known technique, such as but not limited to chemical vapor deposition (CVD) and atomic layer deposition (ALD).

The gate electrode 310 can be formed by any well known technique, such as by blanket depositing a gate electrode material over substrate 300 and then utilizing well known photolithography and etching techniques to pattern the gate electrode material into a gate electrode 310. In an embodiment of the present invention, the gate electrode 310 has a pair of laterally opposite sidewalls separated by a distance which defines the gate length (Lg) of the transistor. In an embodiment of the present invention, gate electrode 310 has a gate length (Lg) of less than 50 nanometers. The gate electrode 310 may be formed from any suitable gate electrode material. In an embodiment of the present invention, the gate electrode material may comprise a polycrystalline silicon. In an embodiment of the present invention, the electrode material comprises a polycrystalline silicon germanium alloy. In yet another embodiment of the present invention, the gate electrode material may comprise a metal film, such as tungsten, tantalum and their nitrides. In an embodiment of the present invention, the gate electrode has a thickness or height between 200-3000 Å.

It is to be appreciated that when forming a nonplanar transistor, such as a tri-gate or dual gate transistor, epitaxial silicon film 302 would first be patterned into a silicon body having a top surface opposite the buried oxide layer 304 and a pair of laterally opposite sidewalls as is well known in the art. When forming a tri-gate device, the gate dielectric layer would be formed on the top surface and sidewalls of the fabricated semiconductor body and then the gate electrode formed on and adjacent to the gate dielectric layers so that the gate electrode surrounds the semiconductor body on three sides as is well known in the art. When forming a dual gate or FINFET device, a thick insulating layer may be left on the top surface of a semiconductor body to isolate the gate electrode from the top surface of a semiconductor body so that the gate electrode controls only the two sidewalls of the body as is well known in the art.

Next, after the formation of gate dielectric layer 308 and gate electrode 310, source/drain extensions 309 may be formed in semiconductor film 302 on opposite sides of gate electrode 310 as shown in FIG. 3B, if desired. Source/drain extensions 309 can be formed by, for example, ion implanting dopants into the silicon layer 302. The gate electrode 310 can act as a mask to prevent the doping of a channel region 320 during the ion implantation process resulting in the formation of source/drain extensions 309 which are formed in alignment with the outside edges of gate electrode 310. A subsequent anneal can be used to cause the dopants to slightly diffusion beneath the outside edges of the gate electrode 310 as shown in FIG. 3B. Then gate electrode 310 is a polysilicon gate electrode the source/drain extension implant process can be used to dope the polysilicon film to reduce its resistance. The source/drain extensions 309 can be used, for example, when the narrow bandgap semiconductor film for the source and drain regions is not extended beneath the gate electrode. When fabricating a transistor where the narrow bandgap semiconductor laterally extends beneath the gate electrode 310, the source/drain extension formation process may not be necessary. Omitting the source/drain extension process can help reduce the thermal budget of the front-end process and thereby improve device performance.

Figure 3C:
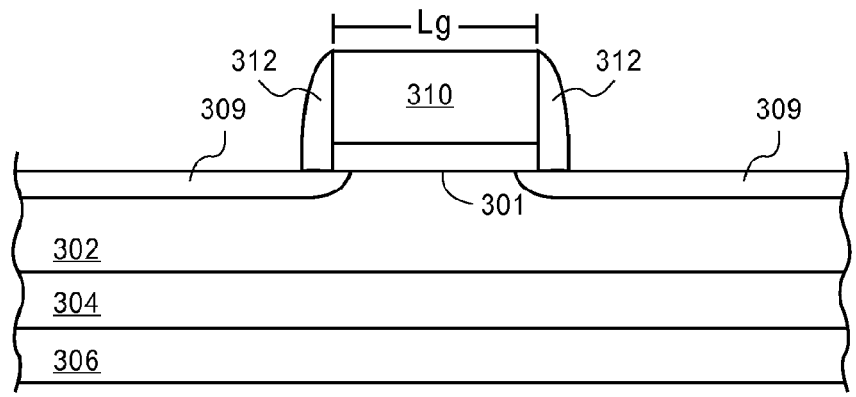

Next, as shown in FIG. 3C, a pair of thin sidewall spacers 312 are formed adjacent to the laterally opposite sidewalls of gate electrode 310. Sidewall spacers 312 can be formed by blanket depositing a conformal insulating film, such as silicon nitride, silicon oxynitride, or silicon oxide or a combination thereof over substrate 300 and gate electrode 310 and then anisotropically etching back the dielectric film to form spacers 312. The thickness of the deposited dielectric film determines the thickness of the spacers 312. In an embodiment of the present invention, the spacers 312 are formed to a thickness between 100-500 Å. In an embodiment of the present invention, the spacers 312 are formed from a silicon nitride film formed by a hot wall low pressure chemical vapor deposition process (LPCVD).

Figure 3D:
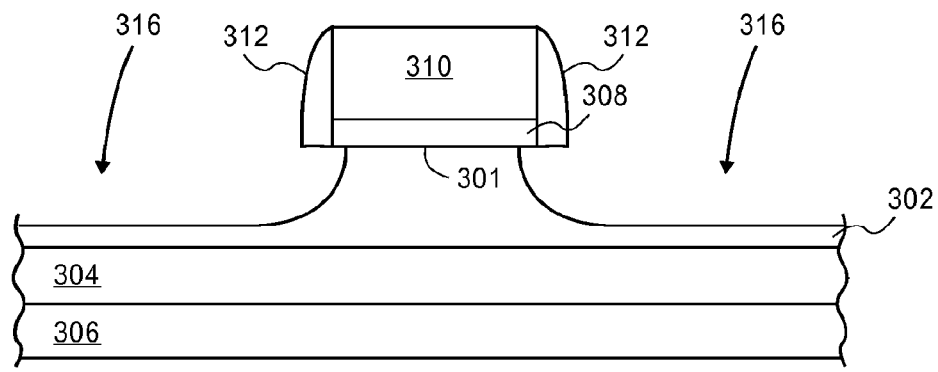

Next, a pair of recesses 316 are formed in silicon film 302 on opposite sides of gate electrode 308 as shown in FIG. 3D. In an embodiment of the present invention, recesses 316 extend beneath the outside edge of gate electrode 310 and gate dielectric layer 308 as shown in FIG. 3D. In an embodiment of the present invention, recesses 316 extend between approximately 50-70 Å beneath the outside edges of the gate electrode 310. In an embodiment of the present invention, the recesses are formed to a depth of approximately 5-350 Å beneath the surface 301 of silicon film 302 upon which the gate dielectric layer 308 is formed. In an embodiment of the present invention, a portion of the silicon film 302 remains in recess 316 above buried oxide layer 304 so that narrow bandgap semiconductor film can be subsequently selectively epitaxially grown thereon. Any well known and suitable etching technique can be utilized to form recesses 316. In an embodiment of the present invention, a selective etch process is used to form recesses 316. In a selective etch process, an etchant is used which only etches silicon films, such as epitaxial silicon layer 302 and not insulating films such as spacers 310, gate dielectric 308 and isolations regions. (If gate electrode 310 is formed from polycrystalline silicon, an insulating hard mask can be used to form gate electrode 310 then left on during the etching of recesses 316 to protect the silicon electrode from being etched). In an embodiment of the present invention, an isotropic etching processes, such as a wet etch, is used to form recesses 316 so that the recess 316 can laterally undercut spacers 312 and gate electrode 310. In an embodiment of the present invention, recesses 316 are formed with a wet etch comprising an ammonium hydroxide or asymmetric or symmetric tetra (alkyl) ammonium hydroxides (alkyl=methyl, ethyl, propyl, isopropyl, butyl, tert-butyl; symmetric meaning all 4 alkyl groups are the same).

Figure 3E:
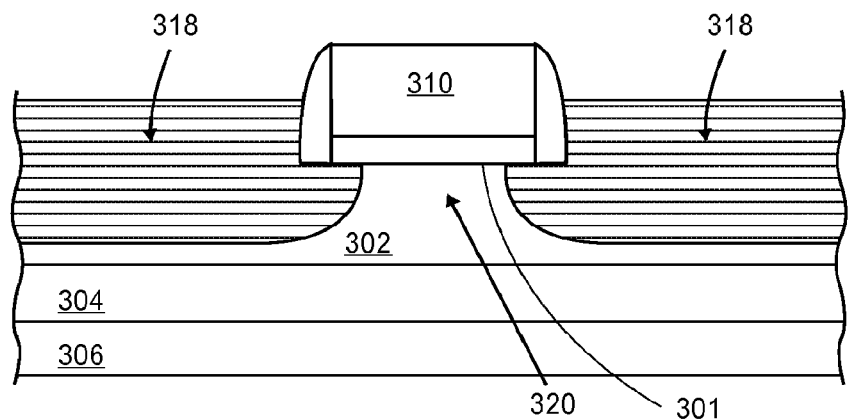

Next, as shown in FIG. 3E, recesses 316 are filled with a narrow bandgap semiconductor film, such as but not limited to indium antimonide (InSb), indium arsenide (InAs), indium gallium arsenide ($In_{1-x}Ga_xAs(x>50\%)$) and indium phosphide (InP). In an embodiment of the present invention, the narrow bandgap semiconductor 318 is deposited to a thickness to fill recess 318 and in another embodiment of the present invention, is deposited to a thickness sufficient to extend above the top surface 301 of silicon film 302 in order to form raised or elevated source and drain regions. In an embodiment of the present invention, the narrow bandgap semiconductor film extends at least 200 Å above top surface 301 of silicon film 302 and in an embodiment of the present invention, extends between 200-500 Å.

Any well known and suitable technique can be used to deposit narrow bandgap semiconductor film 318. In an embodiment of the present invention, the narrow bandgap semiconductor film 318 is grown with an epitaxial process, such as but not limited to, molecular beam epitaxy (MBE), metal organic chemical vapor deposition (MOCVD), and low pressure chemical vapor deposition (LPCVD).

In embodiment of the present invention, the narrow bandgap semiconductor film 318 is insitu doped (i.e., doped while it is deposited) to an n type or p type conductivity. Semiconductor film 318 can be doped to an n type conductivity utilizing dopant atoms, such as silicon (Si) or tellurium (Te) and can be doped to a p type conductivity atoms utilizing, for example, carbon (C), cadmium (Cd), zinc (Zn) and chromium (Cr). In an embodiment of the present invention, the narrow bandgap semiconductor film has a melting temperature between 550-500° C. so that it can be deposited at a relatively low temperature, such as less than 500° C., and still enable dopant atoms to substitute into the narrow bandgap semiconductor lattice without requiring an activation anneal. Eliminating an activation anneal reduces the thermal budget of the process used to fabricate the transistor.

In an alternative embodiment of the present invention, the narrow bandgap semiconductor film 318 can be deposited undoped and then subsequently doped by, for example, ion implantation or solid source diffusion.

In an embodiment of the present invention, the narrow bandgap semiconductor film 318 is selectively grown into recesses 316. In a selective deposition process, the narrow bandgap semiconductor forms only on silicon locations, such as epitaxial silicon film in recesses 316 and not on insulating or dielectric layers, such as sidewall spacers 312 and isolation regions. If gate electrode 310 is formed from a polycrystalline silicon or silicon germanium alloy, then an insulating hard mask can be used during the patterning of the gate electrode and left on during the growth of the narrow bandgap semiconductor 318 in order to prevent the formation of a narrow bandgap semiconductor film on the gate electrode. The epitaxial silicon film 302 in the lower parts of recesses 316 provide a single crystalline lattice from which an epitaxial narrow bandgap semiconductor film can be grown.

In an embodiment of the present invention, an InSb epitaxial silicon film 318 is grown in recess 316 utilizing a MOCVD process utilizing an equimolar gaseous mixture of volatized trimethylindium and stibane ($SbH_3$) with about 5% each by mass in a carrier gas such as argon. In an embodiment of the present invention, an indium antimonide (InSb) epitaxial film is grown utilizing molecular beam epitaxial (MBE) utilizing a solid source.

In embodiment of the present invention, non-alloyed ohmic contacts 340 are used to electrically couple the source and drain region to the upper levels of metallization 350. Accordingly, first an interlayer dielectric (ILD) 330, such as but not limited to silicon dioxide ($SiO_2$), fluorine doped silicon dioxide (SiOF) and carbon doped oxide (CDO), is blanket deposited over substrate 300 including gate electrode 310, spacers 312 and narrow bandgap semiconductor 318. The interlayer dielectric 330 is formed to a thickness sufficient to isolate the gate electrode 310 and narrow bandgap semiconductor 318 from the subsequently formed upper level of metallization 350. In an embodiment of the present invention, the interlayer dielectric is formed to a thickness between 500 Å-2000 Å. It is to be appreciated that an interlayer dielectric need not necessarily be a single layer dielectric and can be a composite dielectric layer formed from multiple insulating layers. After depositing the interlayer dielectric, the interlayer dielectric may be planarized to provide a planar top surface.

Figure 3F:
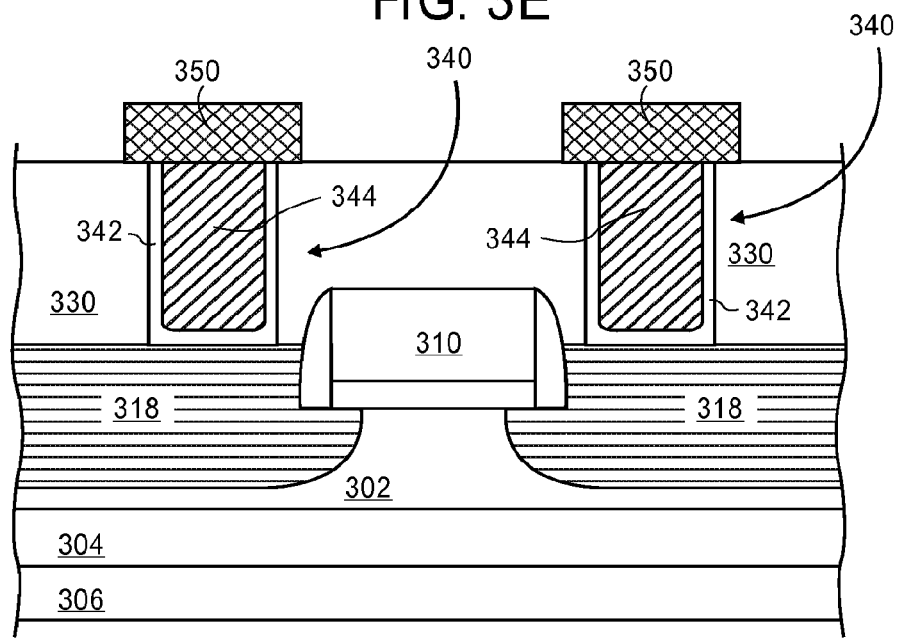

Next, contact openings can then be formed through interlayer dielectric 330 utilizing well known photolithography and etching techniques at locations where contacts 340 are desired to contact the narrow bandgap semiconductor 318. Conductive contacts 340 are then formed into the openings and make direct contact with the narrow bandgap semiconductor film 318. In an embodiment of the present invention, contacts 340 are formed by blanket depositing a conductive contact film by, for example, chemical vapor deposition (CVD) or atomic layer deposition (ALD) into the openings and onto the top surface of ILD 330. The conductive film is then removed from the top surface of the ILD by, for example, plasma etch back or chemical mechanical planarization, to form contacts 340. In an embodiment of the present invention, the contacts are formed from a high conductivity metal or metals having a low work function, such as a work function less than 4 eV. In an embodiment of the present invention, the contacts 340 are bi-layer contacts including a thin adhesion layer 342 and a bulk metal 344 having a high conductivity such as illustrated in FIG. 3F. In an embodiment of the present invention, contacts 340 include a thin titanium (Ti) adhesion layer of less than 150 Å and a gold (Au) bulk material 344. In an embodiment of the present invention, the contacts 340 do not include any alloyed metals or silicides (i.e., metal silicon alloy, such as nickel silicide and titanium silicide). In this way, the thermal budget can remain low and device performance reliability improved. Next, upper levels of metallization 350 can then be formed in contact with contacts 340 to electrically couple the fabricated transistor with other transistors into functional circuits.

This completes the fabrication of a field effect transistor having source and drain regions formed from a narrow bandgap semiconductor.

Figure 6:
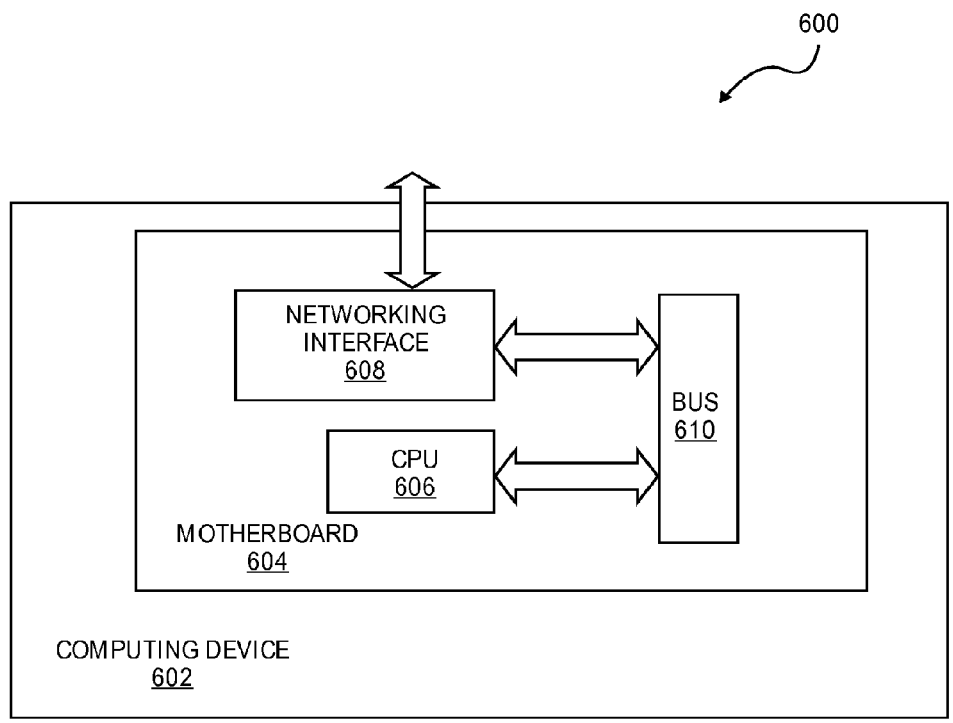
FIG. 6 illustrates a system in accordance with one embodiment.

FIG. 6 illustrates a system 600 in accordance with one embodiment. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise the device 200 or 500 that has the earlier described narrow bandgap source and drain regions.

Depending on the applications, system 600 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described narrow bandgap source and drain regions.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

We claim:
1. A transistor comprising:
a gate dielectric layer formed over a substrate;
a gate electrode formed on the gate dielectric layer; and
a pair of source/drain regions on opposite sides of the gate electrode, the pair of source/drain regions comprising a doped semiconductor film that extends above a top surface of a silicon layer on which the gate dielectric layer is deposited, wherein the semiconductor film comprises a material selected from the group consisting of InSb, InAs, InP and InGaAs; and wherein the semiconductor film is doped to an n-type conductivity with a silicon (Si), a tellurium (Te), or a sulfur (S) dopant.

2. The transistor of claim 1, wherein the semiconductor film comprises InAs.

3. The transistor of claim 1, further comprising a pair of non-alloyed metal contacts directly on the semiconductor film on opposite sides of the gate electrode.

4. The transistor of claim 1, wherein the doped semiconductor film extends beneath at least a portion of the gate electrode.

5. The transistor of claim 1, wherein the semiconductor film is formed in a pair of recesses in the substrate on opposite sides of the gate electrode.

6. The transistor of claim 1, wherein the substrate comprises a buried oxide layer.

7. The transistor of claim 6, wherein the buried oxide layer has a thickness between 200-2,000 angstroms.

8. The transistor of claim 1, wherein the semiconductor film is doped with a concentration level between $1\times10^{16}$-$1\times10^{19}$ atoms/$cm^3$ of the Si dopant.

9. The transistor of claim 1, wherein the gate dielectric layer is formed of a dielectric selected from the group consisting of tantalum pentaoxide, titanium oxide, hafnium oxide, zirconium oxide, aluminum oxide, lead zirconium titanate (PZT), and barium strontium titanate (BST).

10. A transistor comprising:
a substrate comprising a body having a top surface opposite a bottom surface and a pair of sidewalls;
a gate dielectric layer on the body along the top surface and the pair of sidewalls of the body;
a gate electrode on the gate dielectric layer along the top surface and the pair of sidewalls of the body; and
a pair of non-planar source/drain regions on the body on opposite sides of the gate electrode, the pair of non-planar source/drain regions comprising an in situ doped semiconductor film comprising a material selected from the group consisting of InSb, InAs, InP and InGaAs that extends above the top surface on which the gate dielectric layer is deposited, wherein the semiconductor film is doped to an n-type conductivity with a silicon (Si) dopant.

11. The transistor of claim 10, wherein the semiconductor film comprises InAs.

12. The transistor of claim 10, further comprising a pair of non-alloyed metal contacts directly on the semiconductor film on opposite sides of the gate electrode.

13. The transistor of claim 10, wherein the semiconductor film extends beneath at least a portion of the gate electrode.

14. The transistor of claim 10, wherein the substrate comprises a buried oxide layer.

15. The transistor of claim 10, wherein the semiconductor film is formed in a pair of recesses in the body on opposite sides of the gate electrode.

16. The transistor of claim 10, wherein the body is on the buried oxide layer.

17. The transistor of claim 16, wherein the buried oxide layer has a thickness between 200-2,000 angstroms.

18. The transistor of claim 10, wherein the semiconductor film is doped with a concentration level between $1\times10^{16}$-$1\times10^{19}$ atoms/cm$^3$ of the Si dopant.

19. The transistor of claim 10, wherein the gate dielectric layer is formed of a dielectric selected from the group consisting of tantalum pentaoxide, titanium oxide, hafnium oxide, zirconium oxide, aluminum oxide, lead zirconium titanate (PZT), and barium strontium titanate (BST).

* * * * *